(12) United States Patent
Hirota

(10) Patent No.: US 8,071,439 B2
(45) Date of Patent: Dec. 6, 2011

(54) METHOD FOR MANUFACTURING SEMICONDUCTOR DEVICE

(75) Inventor: Toshiyuki Hirota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 41 days.

(21) Appl. No.: 12/461,313

(22) Filed: Aug. 7, 2009

(65) Prior Publication Data

US 2010/0035402 A1 Feb. 11, 2010

(30) Foreign Application Priority Data

Aug. 8, 2008 (JP) .................................. 2008-205449

(51) Int. Cl.
*H01L 21/8242* (2006.01)

(52) U.S. Cl. . 438/243; 438/386; 257/301; 257/E21.008; 257/E27.016

(58) Field of Classification Search .................. 438/243, 438/244, 386, 387; 257/301, E21.008, E27.016
See application file for complete search history.

(56) References Cited

U.S. PATENT DOCUMENTS

| 6,150,281 A | 11/2000 | Kwean | |
|---|---|---|---|
| 6,743,693 B2 * | 6/2004 | Fujiishi | 438/386 |
| 2006/0032833 A1 * | 2/2006 | Kawaguchi et al. | 216/37 |
| 2007/0048976 A1 * | 3/2007 | Raghu | 438/478 |
| 2008/0308854 A1 * | 12/2008 | Takaishi | 257/304 |
| 2009/0108402 A1 * | 4/2009 | Bae et al. | 257/532 |

FOREIGN PATENT DOCUMENTS

| JP | 2000-003883 A | 1/2000 |
|---|---|---|
| JP | 2000-021985 A | 1/2000 |
| JP | 2004-311918 A | 11/2004 |
| JP | 2005-332978 A | 12/2005 |
| JP | 2007-027180 A | 2/2007 |

* cited by examiner

*Primary Examiner* — Hsien Ming Lee
(74) *Attorney, Agent, or Firm* — Foley & Lardner LLP

(57) ABSTRACT

A method for manufacturing a semiconductor device includes forming a first interlayer insulating film over a semiconductor substrate; forming a first opening in the first interlayer insulating film; forming a second interlayer insulating film on the first interlayer insulating film such that the first opening is not filled; and forming a second opening in the second interlayer insulating film such that the second opening is connected to the first opening.

11 Claims, 24 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of Related Art

With miniaturization progressing, there has been a demand for an increase in the surface area of a capacitor electrode for each memory cell in a memory device, for example, a DRAM in a generation with a 50-nm design rule (F value) or any subsequent generation. A common method for forming a capacitor electrode with a large surface area includes forming a conductive film in a small opening with a high aspect ratio and processing the conductive film into a capacitor electrode.

However, a higher aspect ratio makes the controllable formation of a small opening more difficult. That is, an attempt to form an opening with a high aspect ratio by normal dry etching may result in a phenomenon called etch stop. In this case, forming a hole with a desired shape is difficult particularly at the bottom of the opening.

In case of forming a contact plug with a high aspect ratio, a similar problem may occur when an opening (contact hole) with a high aspect ratio is formed.

A proposed method for forming a contact plug includes forming a lower layer-side plug and forming an upper layer-side plug on the lower layer-side plug to produce a plug stack structure. Such a plug stack structure is described in, for example, Japanese Patent Laid-Open Nos. 2005-332978 and 2004-311918.

As described above, disadvantageously, forming an opening with a high aspect ratio is not easy. Furthermore, the method of forming a stack structure as described above may increase the number of steps required to form the target structure. This may prevent semiconductor devices from being inexpensively manufactured.

SUMMARY

In one embodiment, there is provided a method for manufacturing a semiconductor device including: forming a first interlayer insulating film over a semiconductor substrate; forming a first opening in the first interlayer insulating film; forming a second interlayer insulating film on the first interlayer insulating film such that the first opening is not filled; and forming a second opening in the second interlayer insulating film such the second opening is connected to the first opening to form a coupled opening.

In another embodiment, there is provided a method for manufacturing a semiconductor device including forming a through-hole in an interlayer insulating film, wherein the interlayer insulating film is obtained by stacking a partial interlayer insulating film plural times; and the through-hole is obtained by forming a lower layer-side partial interlayer insulating film, forming an opening in the lower layer-side partial interlayer insulating film, forming an upper layer-side partial interlayer insulating film on the lower layer-side partial interlayer insulating film with the opening formed therein such that the opening is not filled, and forming an opening in the upper layer-side partial interlayer insulating film such that the opening in the upper layer-side partial interlayer insulating film is connected to the opening in the lower layer-side partial interlayer insulating film.

According to an embodiment, a small opening with a high aspect ratio can be easily formed without the need to increase the number of manufacturing steps. Thus, a method for manufacturing a semiconductor device which method is excellent in miniaturization can be provided. For example, the exemplary embodiment enables the easy formation of such an opening with a high aspect ratio as required for a semiconductor device manufactured according to a design rule including a feature size (F value) of 50 nm or less. As a result, a contact plug with a high aspect ratio and a capacitor electrode with a large surface area can be easily formed with an increase in manufacturing costs prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
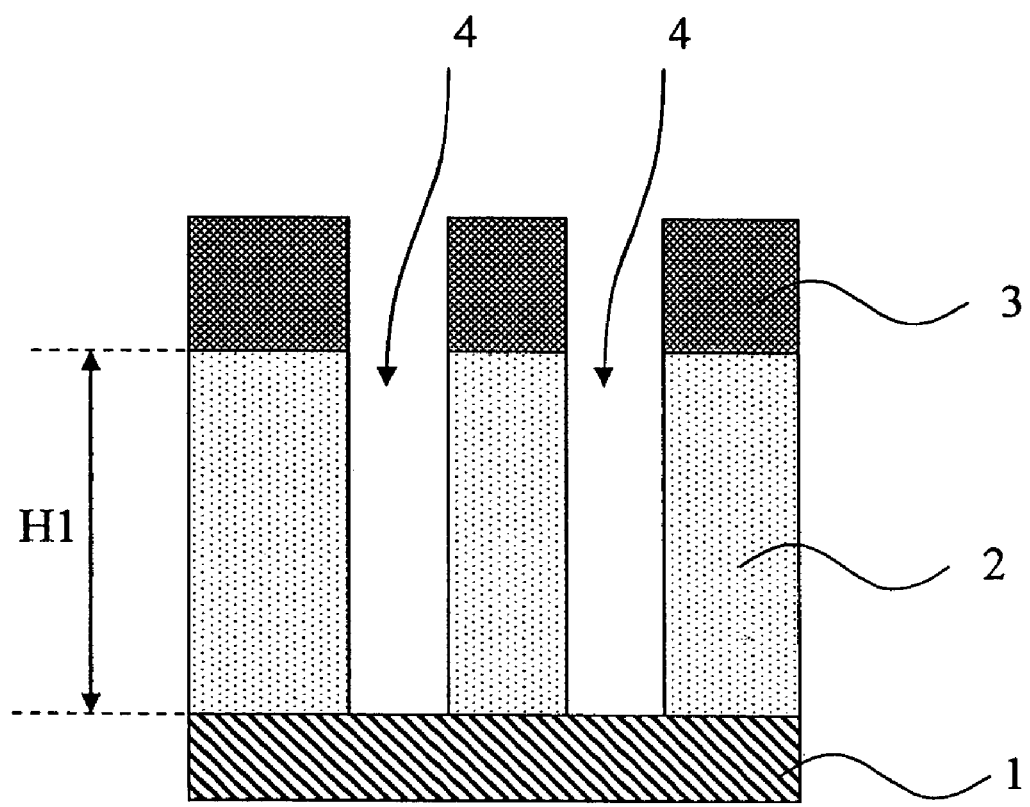
FIG. 1 is a sectional view of a structure in which a first opening has been formed, illustrating a first exemplary embodiment.

An exemplary embodiment relates to a method for forming an opening with a high aspect ratio which is difficult to form by a single operation of dry etching. In order to form an interlayer insulating film having a target opening (hole or trench) with a high aspect ratio, the method includes forming a insulating film at least twice (the insulating film is hereinafter referred to as a "partial interlayer insulating film", which is a component of the interlayer insulating film having the target opening), and forming an opening in each partial interlayer insulating film. In the method, on a previous partial interlayer insulating film with an opening formed therein, a next partial interlayer insulating film is formed so as to avoid filling the opening. Then, an opening is formed in the upper layer-side partial interlayer insulating film so as to connect to the opening in the lower layer-side partial interlayer insulating film. As a result, the upper layer-side opening and the lower layer-side opening are integrally coupled together to provide a target opening (coupling hole) penetrating the upper layer-side partial interlayer insulating film and the lower layer-side partial interlayer insulating film.

For example, if the interlayer insulating film is formed in two steps, that is, by forming a first interlayer insulating film and then forming a second interlayer insulating film, a first opening is formed in the first interlayer insulating film, and the second interlayer insulating film is formed on the first interlayer insulating film so as to avoid filling the second interlayer insulating film into the first opening. Thereafter, a second opening is formed in the second interlayer insulating film so as to lie on the first opening and reach it. As a result, the first opening and the second opening can be integrated together to form the target opening (coupling hole). If the interlayer insulating film is formed in three steps, a third interlayer insulating film is formed on the second interlayer insulating film so as to avoid filling the first opening and second opening formed as described above. Then, a third opening is formed in the third interlayer insulating film so as to lie on the second opening and reach it. As a result, the first opening, the second opening, and the third opening can be integrated together to form the target opening (coupling hole). If the interlayer insulating film is formed in four or more steps, a further upper layer-side partial interlayer insulating film is formed. An opening is then formed in the upper layer-side partial interlayer insulating film to form a target opening (coupling hole).

Here, when the upper layer-side partial interlayer insulating film is formed so as to avoid filling the opening formed in the lower layer-side partial interlayer insulating film, an insulating film may be formed on the inner side surface of the opening, provided that the opening is not internally occluded. The insulating film formed on the inner side surface of the opening can be removed by wet etching after the target opening (coupling hole) has been formed, as required.

Exemplary embodiments will be described below with reference to the drawings. In the description below, the opening size of an opening means an opening diameter when the opening is a hole, or the width of the opening in a direction perpendicular to the longitudinal direction thereof when the opening is a trench.

First Exemplary Embodiment

As a first exemplary embodiment, an example of a case will be described where an opening with a high aspect ratio is formed and a-contact plug is then formed in the opening. The method for forming an opening described below is not limited to the formation of a contact plug.

First, a semiconductor substrate 1 is prepared where a desired impurity diffusion layer region and a desired wiring layer (not shown in the drawings) are formed thereon.

Then, as shown in FIG. 1, a first interlayer insulating film 2 such as a silicon oxide film ($SiO_2$) is formed on the semiconductor substrate 1. An opening (hole) pattern of a photo resist film 3 is formed on the first interlayer insulating film 2 using a lithography technique. Then, a first opening 4 is formed by dry etching through the opening pattern as a mask. Here, with the opening size of the first opening 4 taken into account, the film thickness H1 of the first interlayer insulating film 2 is preset to a thickness within a range where an opening of a desired shape penetrating the first interlayer insulating film 2 can be formed by normal dry etching. The photo resist film 3 is removed after the formation of the first opening 4.

Figure 2:
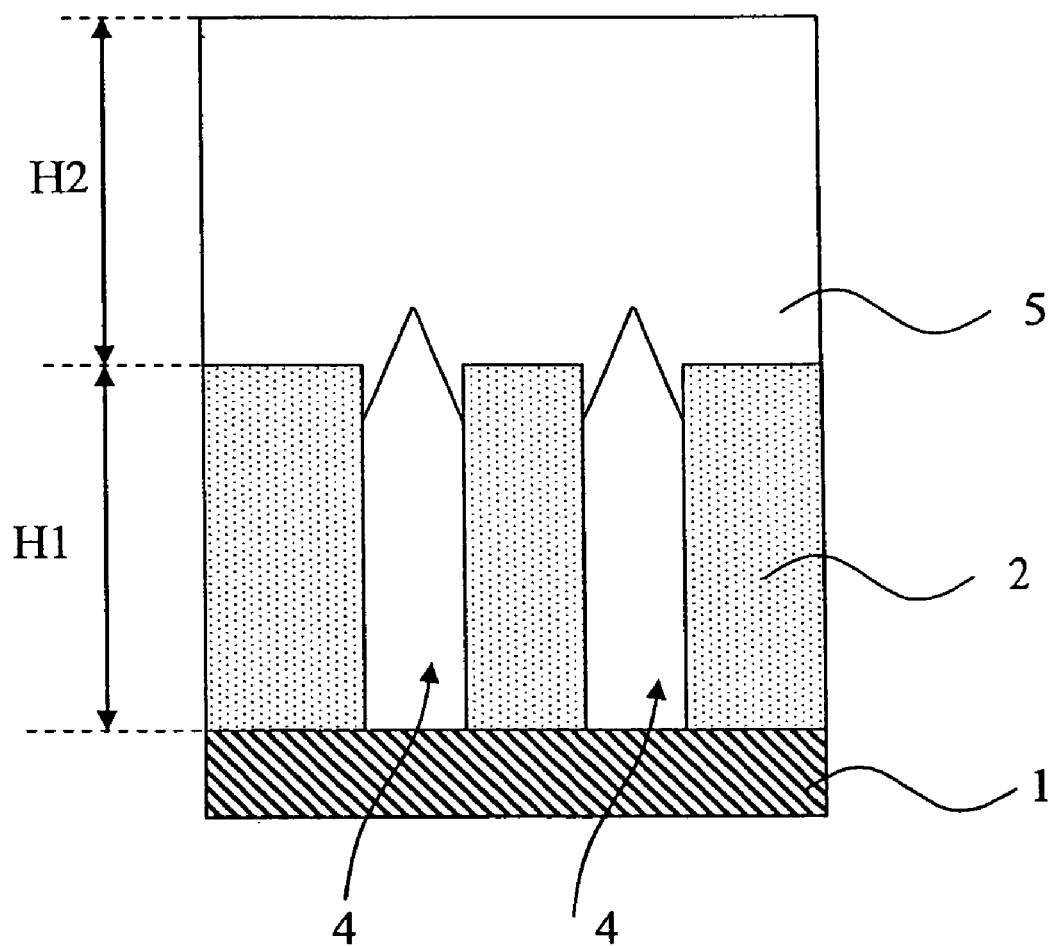
FIG. 2 is a sectional view of the structure in which a step following the step of forming the structure shown in FIG. 1 has been carried out.

Then, as shown in FIG. 2, a second interlayer insulating film 5 such as a silicon oxide film is formed on the first interlayer insulating film 2. Here, if the size (diameter) of the upper portion of the first opening 4 is very small, about one hundred and several tens of nm, then by using a deposition method such as a PE-CVD (Plasma Enhanced Chemical Vapor Deposition) method which offers a low step coverage, the upper portion of the first opening 4 can be covered with the second interlayer insulating film 5 before the second interlayer insulating film 5 is filled into the first opening 4. Thus, with the second interlayer insulating film 5 inhibited from being filled into the first opening 4, the second interlayer insulating film 5 can be formed on the first interlayer insulating film 2. Specifically, as the second interlayer insulating film 5, for example, a silicon oxide film can be formed by a plasma CVD method using TEOS (tetraethoxysilane) or a plasma CVD method using silane ($SiH_4$) and nitrous oxide ($N_2O$). The silicon oxide film may be doped with impurities such as phosphorous or boron. The second interlayer insulating film 5 need not be perfectly inhibited from being formed inside the first opening 4. Provided that the first opening 4 is not closed and a cavity portion remains therein, no problem occurs if the second interlayer insulating film 5 adheres to the inner side surface of the first opening 4.

The top surface of the second interlayer insulating film 5 is flattened by CMP (Chemical Mechanical Polishing) as required so that the second interlayer insulating film 5 finally has a desired film thickness H2.

Figure 3:
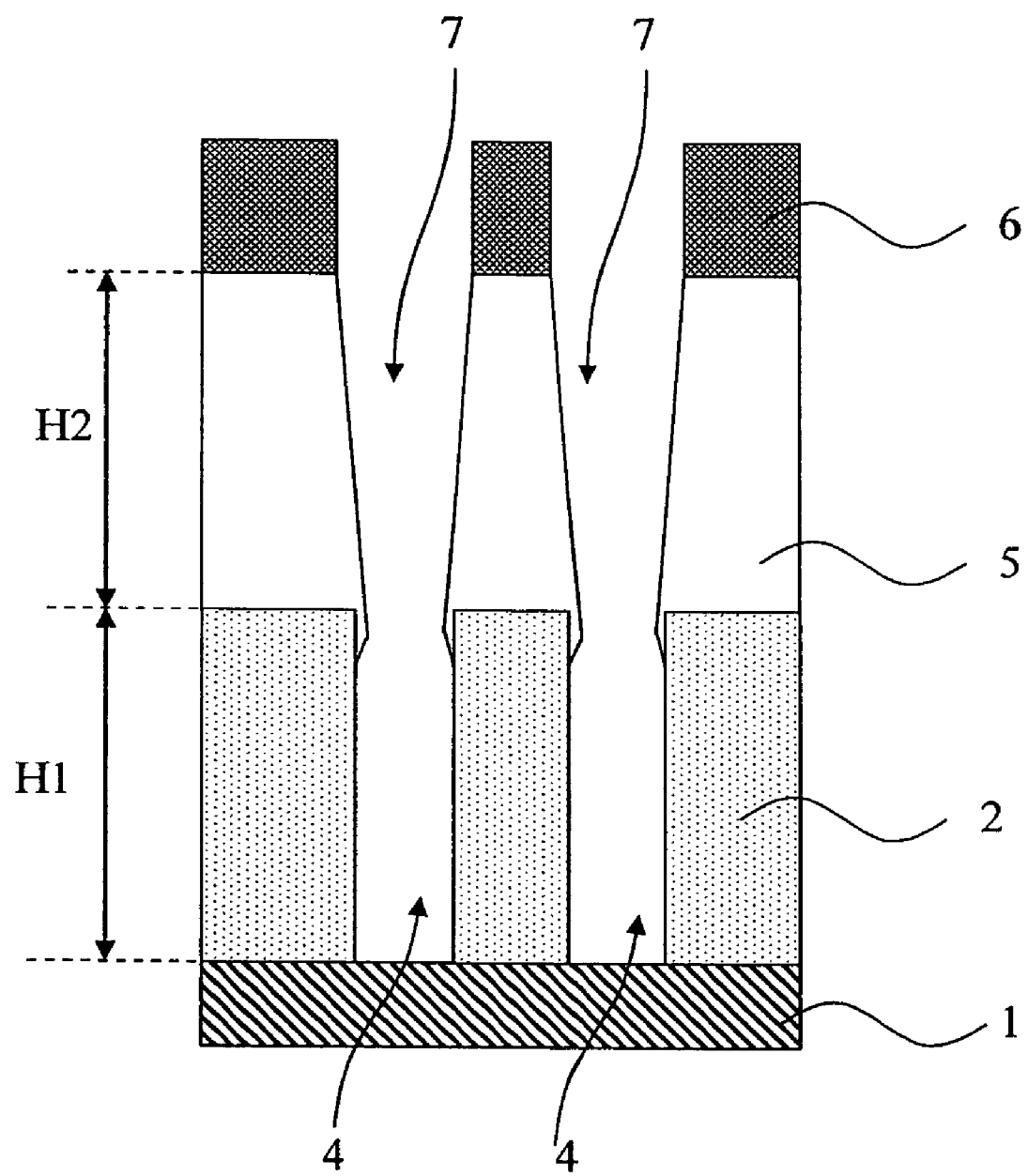
FIG. 3 is a sectional view of the structure in which a step following the step of forming the structure shown in FIG. 2 has been carried out.

Then, as shown in FIG. 3, an opening pattern of the photo resist film 6 is formed on the second interlayer insulating film 5 using a lithography technique. At this time, the opening pattern (photo resist film 6) is formed such that the opening in the opening pattern overlaps the already formed first opening 4. In the overlapping portion, the opening size of the opening pattern need not necessarily be the same as that of the first opening 4. Then, dry etching is performed through the opening pattern (photo resist film 6) as a mask to form the second opening 7. Thus, the first opening 4 and the second opening 7 are connected together to form one through-hole penetrating the first interlayer insulating film 2 and the second interlayer insulating film 5. Here, with the opening size of the second opening 7 taken into account, the film thickness H2 of the second interlayer insulating film 5 is preset to a thickness within a range where an opening of a desired shape penetrating the second interlayer insulating film 5 can be formed by normal dry etching. The photo resist film 6 is removed after the formation of the second opening 7.

Figure 4:
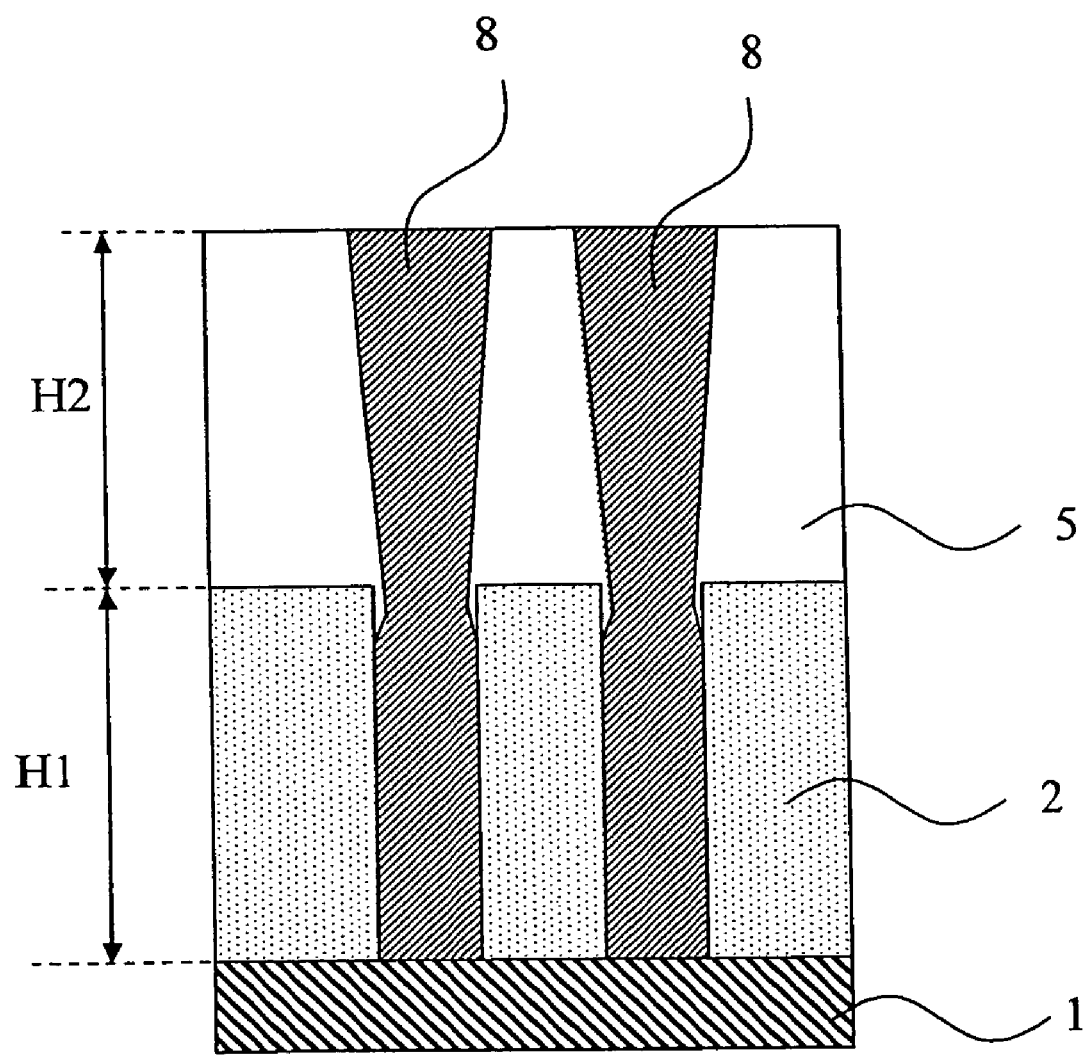
FIG. 4 is a sectional view of the structure in which a step following the step of forming the structure shown in FIG. 3 has been carried out.

Then, as shown in FIG. 4, a conductive film 8 is formed so as to fill the first opening 4 and second opening 7. Specifically, the conductive film 8 such as tungsten (W) is formed using the CVD method so as to cover the interior of the first opening 4 and second opening 7 and the top surface of the second interlayer insulating film 5. A part of the conductive film 8 located above the top surface of the interlayer insulating film 5 is removed by CMP or the like to leave the conductive film 8 only inside the first opening 4 and the second opening 7. The conductive film 8 functions as a contact plug. The conductive film 8 may be a multilayer stack including a barrier film such as titanium nitride (TiN) and another conductive film.

In the related art, for example, if an opening that has an opening size (diameter) of 60 nm is formed in an interlayer insulating film having a film thickness of 3.0 μm, an aspect ratio of the opening is 50. It is difficult to form such an opening by a single etching successfully. According to the present exemplary embodiment, when the thicknesses of the first and second interlayer insulating films are set to, for example, H1=1.5 μm and H2=1.5 μm, respectively, if each of openings that are formed in the first and second interlayer insulating films has an opening size of 60 nm, the aspect ratio thereof is 25. Every opening can thus be easily formed by the conventional dry etching.

To allow each of the openings that are to be connected together, to be controllably formed by a single etching operation, the aspect ratio of each of the openings is preferably set to at most 30 and more preferably to at most 25. To obtain such an aspect ratio, the thickness of each of the interlayer insulating films in which the opening is formed can be set according to the predetermined opening size of each opening. In the above-described example, the target opening (coupling hole) is formed by connecting the two openings together. However, a plurality of, that is, at least three openings may be connected together as in a fourth exemplary embodiment described below. Connecting more openings together allows the desired aspect ratio to be ensured for each opening in spite of a small opening size.

The aspect ratio of each opening formed in the corresponding interlayer insulating film is not necessarily limited to 30. That is, provided that the opening can be controllably formed by a single etching operation with possible etch stop phenomenon prevented from occurring at the bottom of the opening, an opening with an aspect ratio of 30 or more may be formed in each interlayer insulating film.

The present exemplary embodiment eliminates the need to perform the following for every formation of an opening: the formation of the conductive film 8 for filling the opening, the removal of an unwanted part of the conductive film located outside the opening, and the flattening of the top surface. A plug can be formed after the formation of the target opening (coupling hole). Thus, a contact plug with a high aspect ratio can be formed with an increase in manufacturing costs prevented.

Second Exemplary Embodiment

As a second exemplary embodiment, an example of a case will be described where an opening with a high aspect ratio is formed and used to form a DRAM capacitor.

First, a semiconductor substrate 101 with transistors and wires (not shown in the drawings) formed thereon is prepared.

Figure 5:
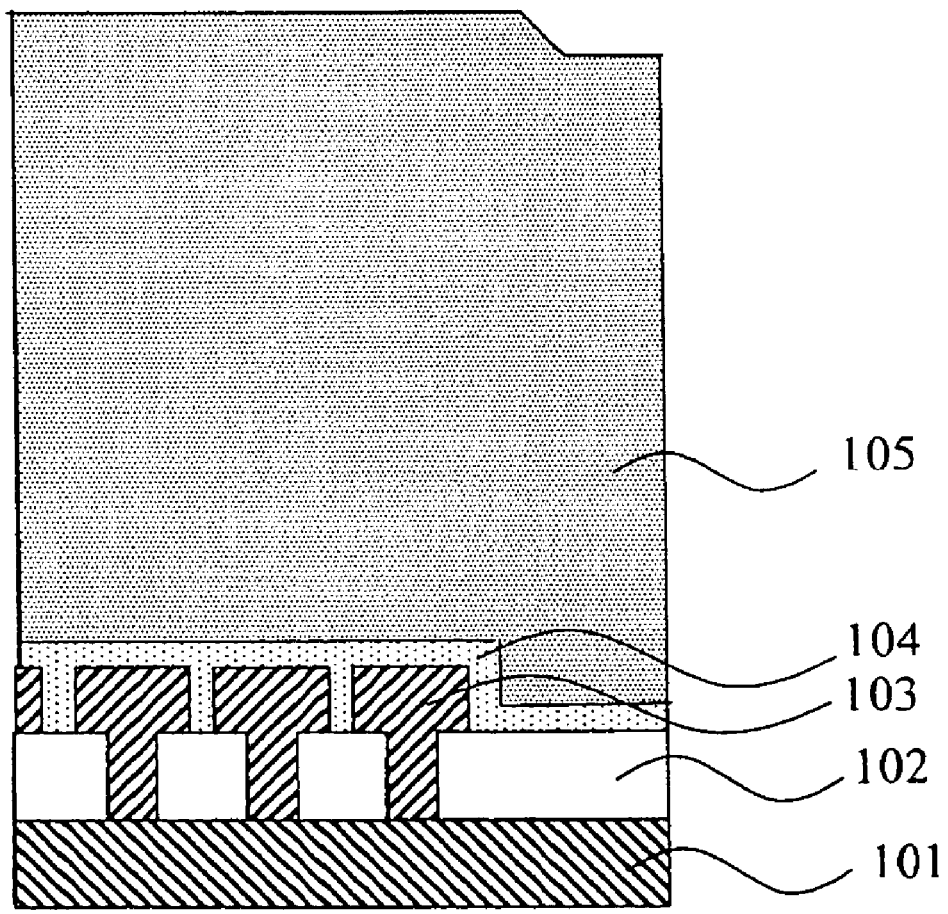
FIG. 5 is a sectional view of a structure in which a first interlayer insulating film has been formed, illustrating a second exemplary embodiment.

Then, as shown in FIG. 5, an interlayer insulating film 102 such as a silicon oxide film ($SiO_2$) is formed on the semiconductor substrate 101. An opening is formed in the interlayer insulating film 102 at a desired position. A conductive film such as a polycrystalline silicon with impurities doped therein is buried in the opening. The conductive film is patterned using a normal photolithography technique and a normal dry etching technique. As a result, a capacitor contact plug 103 is obtained.

Thereafter, a silicon nitride film ($Si_3N_4$) 104 is formed by an LP-CVD method, an ALD (Atomic Layer Deposition) method, or the like. A first interlayer insulating film 105 such as a silicon oxide film is further formed.

Figure 6:
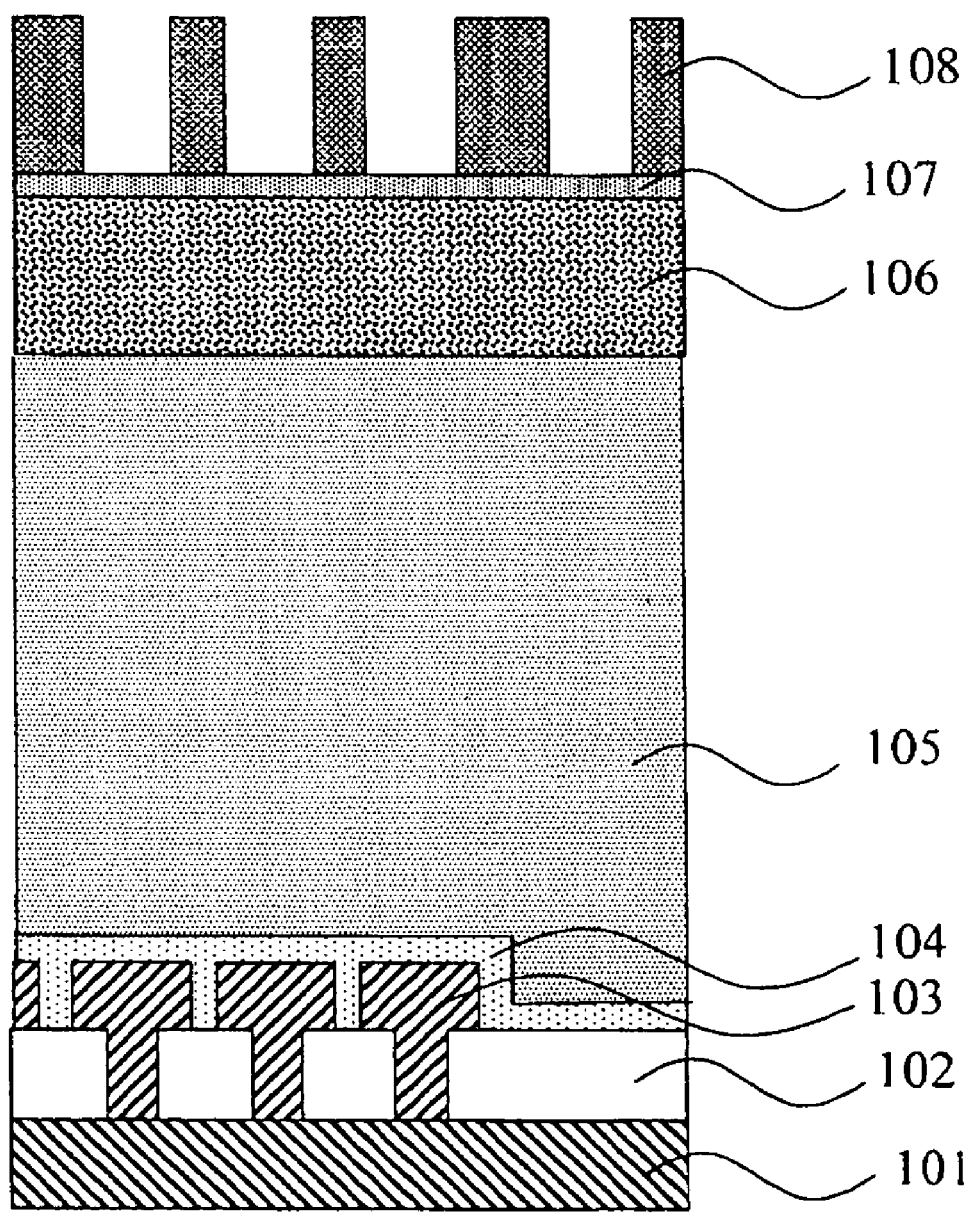
FIG. 6 is a sectional view of the structure in which a step following the step of forming the structure shown in FIG. 5 has been carried out.

Then, as shown in FIG. 6, the top surface of the first interlayer insulating film 105 is flattened by CMP or the like as required. Thereafter, a carbon film 106 is formed, and an intermediate mask layer 107 is formed on the carbon film 106 using a silicon oxide type inorganic film. An opening pattern of a photo resist film 108 is formed using the lithography technique. The carbon film 106 and the intermediate mask layer 107 function as a hard mask for dry etching.

Figure 7:
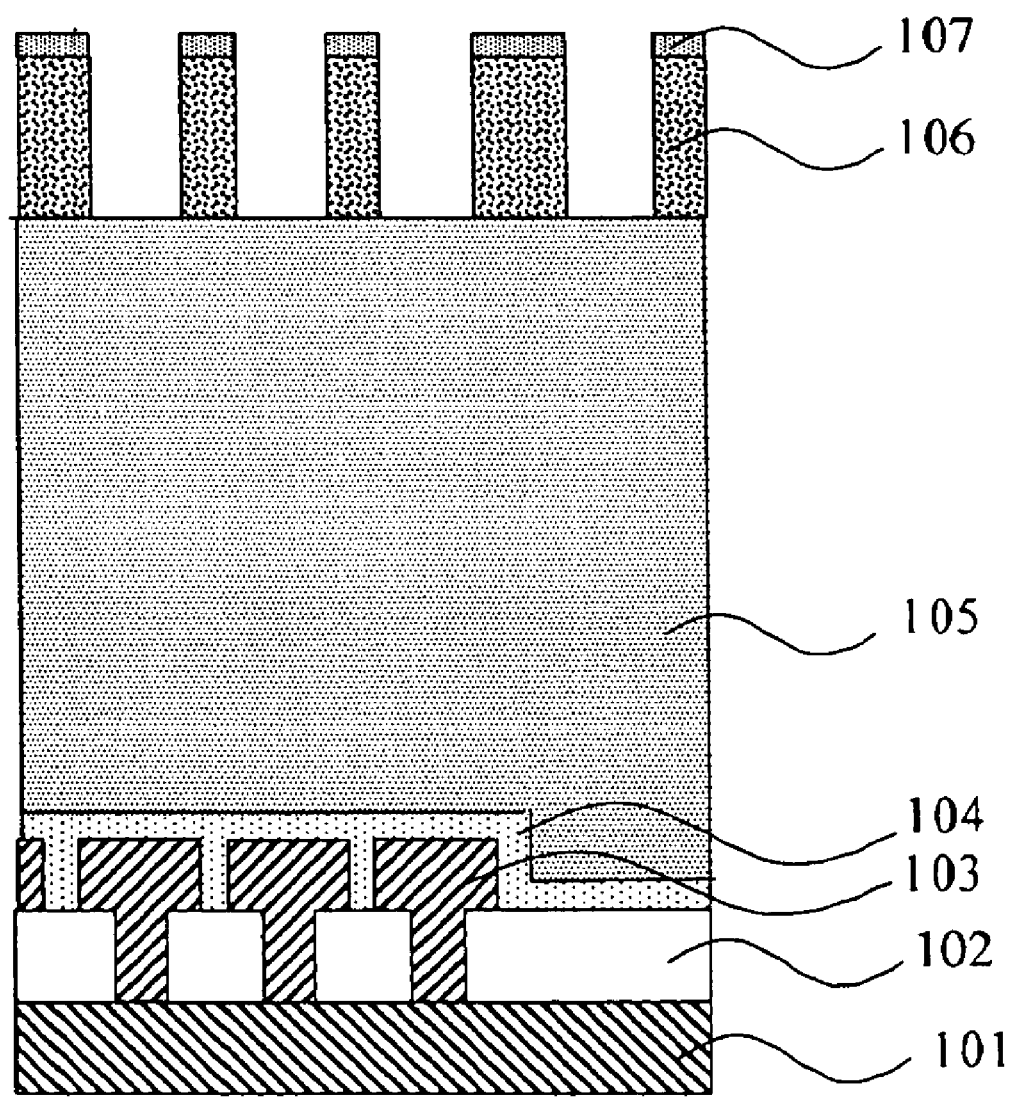
FIG. 7 is a sectional view of the structure in which a step following the step of forming the structure shown in FIG. 6 has been carried out.

Then, as shown in FIG. 7, the intermediate mask layer 107 is patterned through the opening pattern of the photo resist film 108 as a mask. The carbon film 106 is further patterned through the patterned intermediate mask layer 107 as a mask. At this time, the photo resist film 108 itself is also etched and finally disappear.

Figure 8:
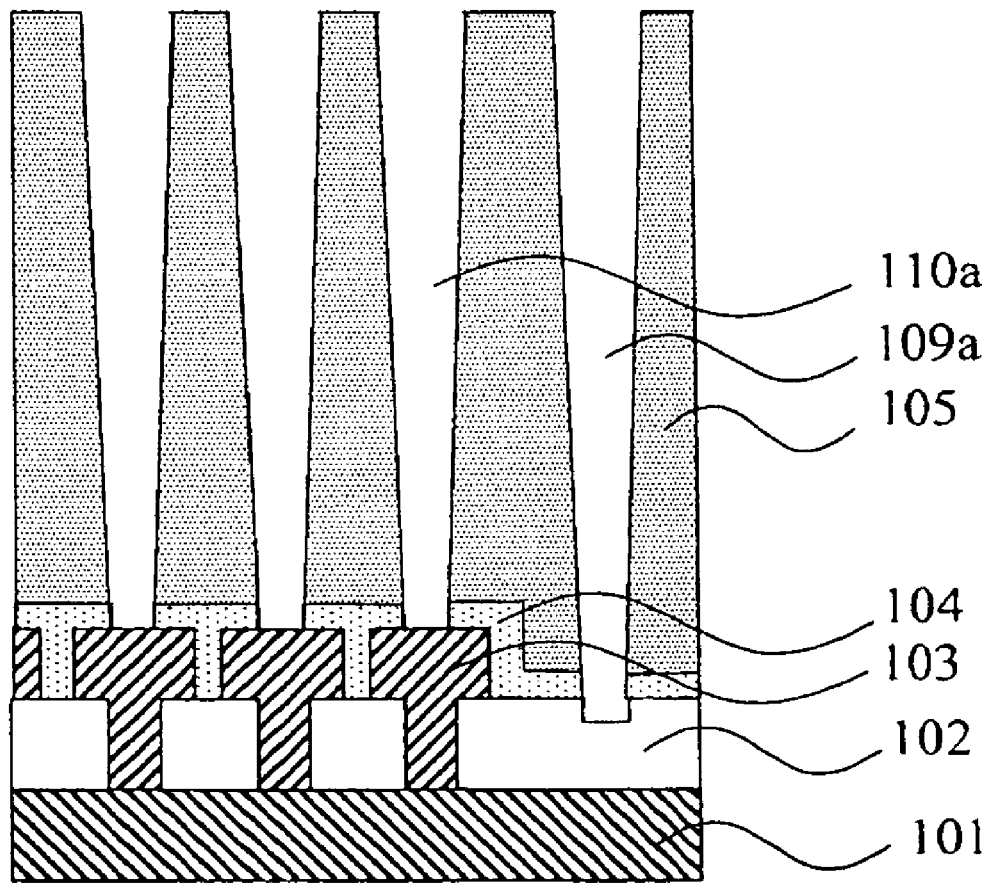
FIG. 8 is a sectional view of the structure in which a step following the step of forming the structure shown in FIG. 7 has been carried out.

Then, as shown in FIG. 8, the first interlayer insulating film 105 and the silicon nitride film 104 are patterned through the patterned carbon film 106 as a mask. A first opening 110a is thus formed on the capacitor contact plug 103. The first opening 110a serves as a "mold" for a capacitor lower electrode that is to be formed in a storage node section of a memory cell. At the same time, a first trench 109a serving as a "mold" for a guard ring is formed so as to surround a memory cell array in a DRAM. Thereafter, the carbon film 106 is removed by an ashing method or the like.

Figure 9:
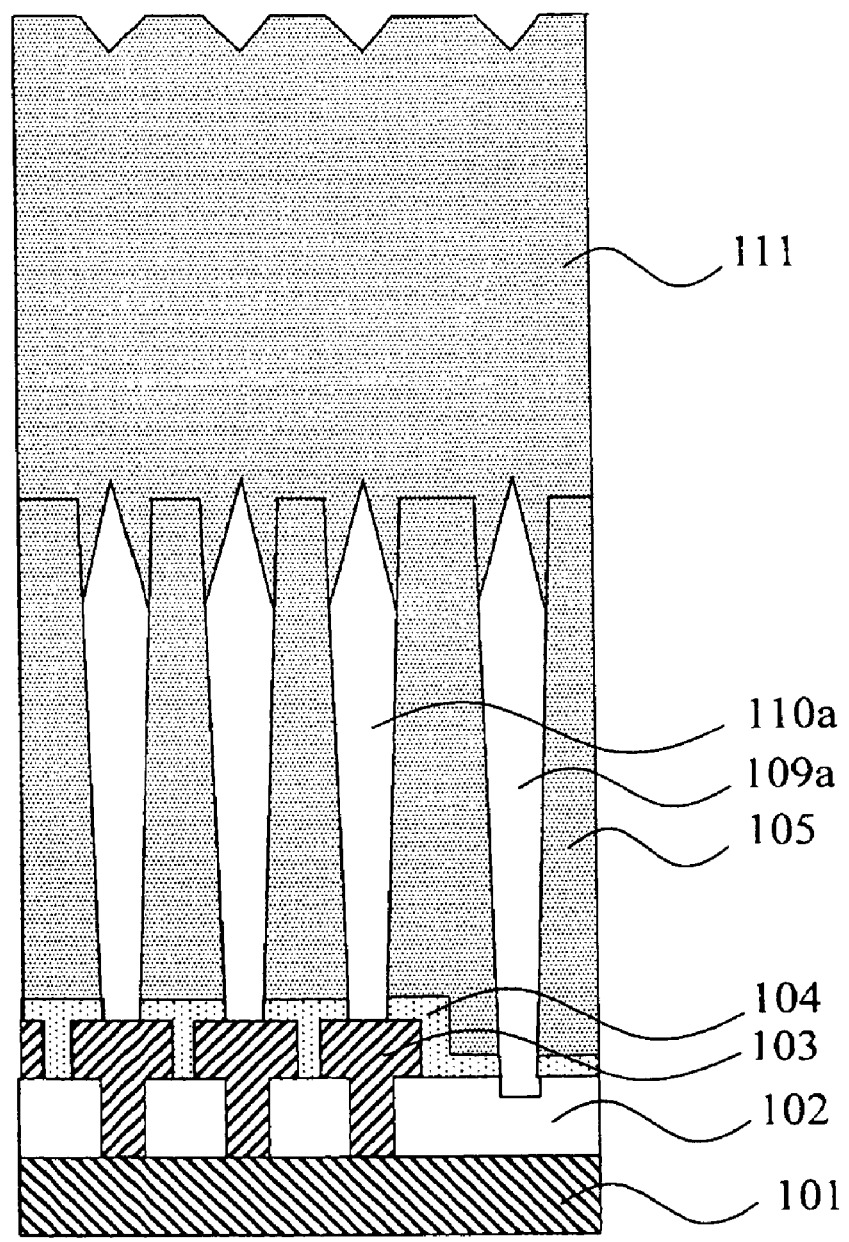
FIG. 9 is a sectional view of the structure in which a step following the step of forming the structure shown in FIG. 8 has been carried out.

Then, as shown in FIG. 9, a second interlayer insulating film 111 is formed on the first interlayer insulating film 105. At this time, the second interlayer insulating film 111 is formed using a deposition method such as the PE-CVD method which offers a low step coverage, so as to avoid filling the first opening 110a and first trench 109a formed in the first interlayer insulating film 105. Specifically, as the second interlayer insulating film 111, for example, a silicon oxide film can be formed by the plasma CVD method using YTEOS. (Tetra Ethoxy Silane) or the plasma CVD method using silane ($SiH_4$) and $N_2O$. An interlayer insulating film doped with impurities such as phosphorous or boron may be formed in order to obtain a desired hole shape by wet etching described below with reference to FIG. 12. The concentration of the impurities may be varies in a film thickness direction (which is perpendicular to the substrate surface) in order to control the profile of the hole.

Figure 10:
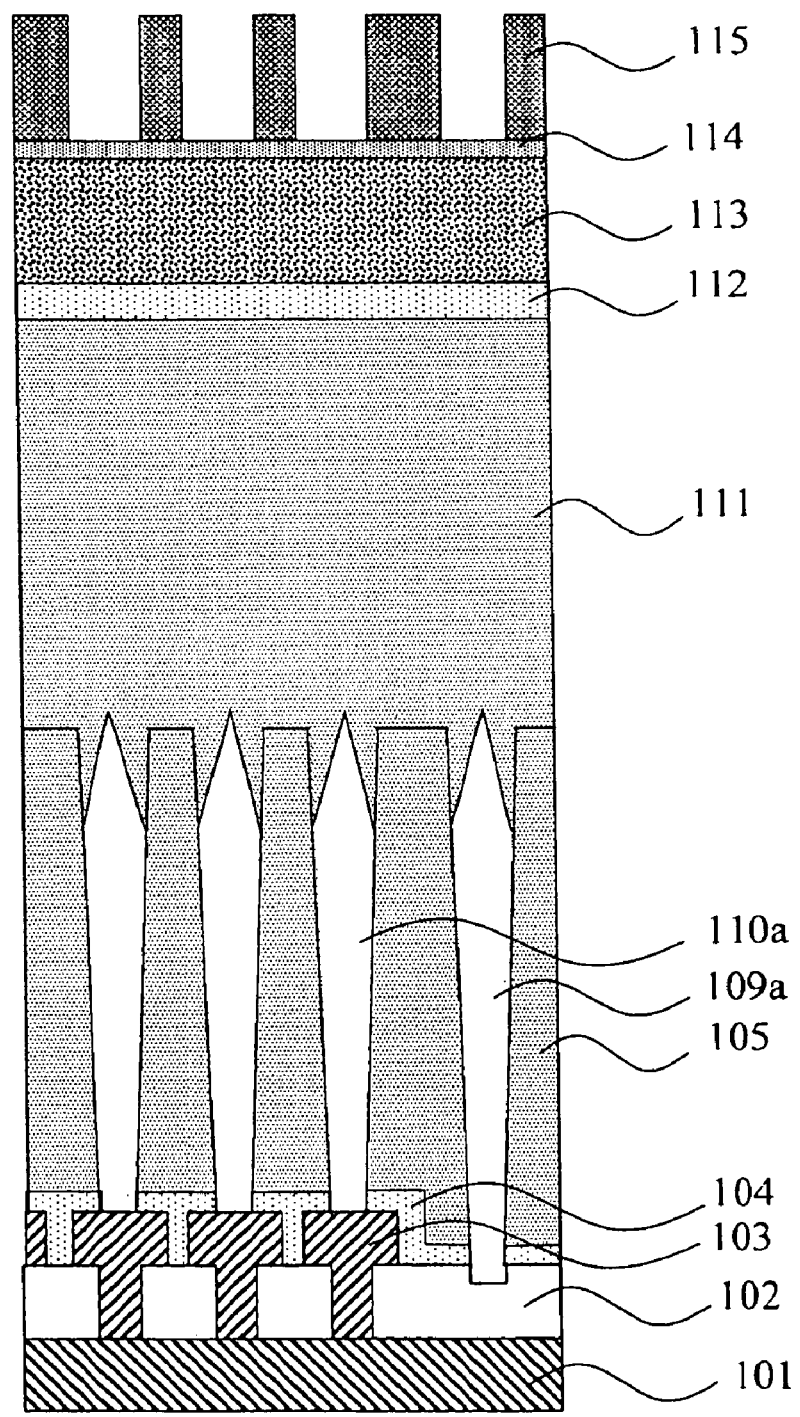
FIG. 10 is a sectional view of the structure in which a step following the step of forming the structure shown in FIG. 9 has been carried out.

Then, as shown in FIG. 10, the top surface of the second interlayer insulating film 111 is flattened by CMP or the like as required. Thereafter, a silicon nitride film 112, a carbon film 113, and an intermediate mask layer 114 are formed thereon. An opening pattern of a photo resist film 115 is formed using the normal lithography technique. At this time, the opening pattern of the photo resist film 115 is formed so as to be the same as that of the photo resist film 108 shown in FIG. 6. Alignment for exposure can be performed on the opening pattern of openings shown in FIG. 8. That is, the openings of the opening pattern of the photo resist film 115 are laid immediately above the first opening 110a and the first trench 109a.

Figure 11:
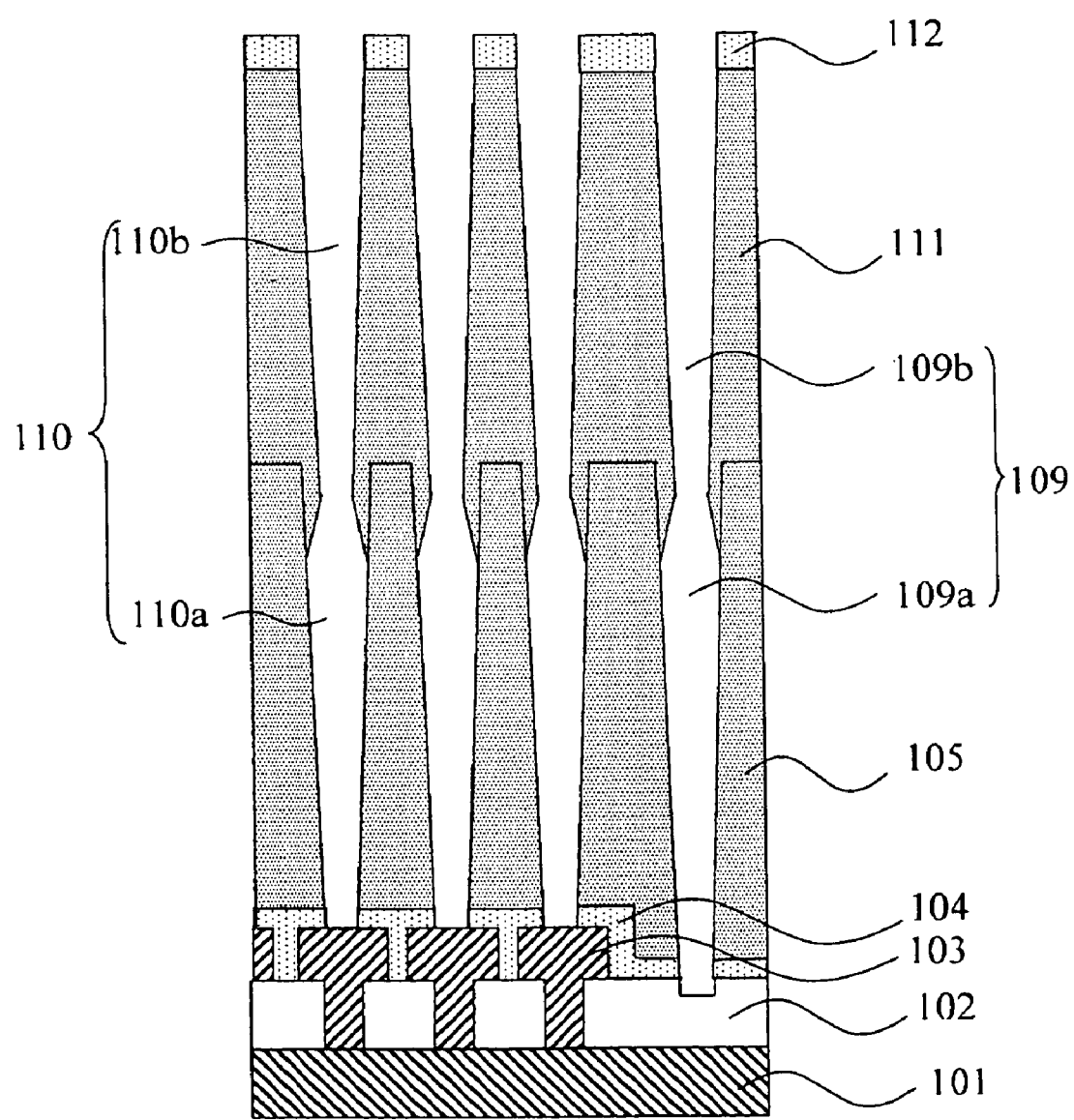
FIG. 11 is a sectional view of the structure in which a step following the step of forming the structure shown in FIG. 10 has been carried out.

Then, the intermediate mask layer 114 is patterned using the dry etching technique, through the opening pattern of the photo resist film 115 as a mask. The carbon film 113 is then patterned through the patterned intermediate mask layer 114 as a mask. Then, as shown in FIG. 11, the silicon nitride film 112 and the second interlayer insulating film 111 are then patterned through the patterned carbon film 113 as a mask to form a second opening 110b and a second trench 109b. The carbon film 113 is thereafter removed by the ashing method or the like. The opening formed in the second interlayer insulating film 111 is located immediately above the opening formed in the first interlayer insulating film 105. As a result, the upper and lower openings are integrated together to form a opening 110 and trench 109 penetrating the silicon nitride film 112, the second interlayer insulating film 111, the first interlayer insulating film 105, and the silicon nitride film 104. At this time, the bottom of the first opening 110a formed in the first interlayer insulating film 105 is exposed to dry etching. However, the bottom of the opening is not subjected to such damage as poses a major problem because of the high aspect ratio of the integral opening 110 penetrating the first and second interlayer insulating films 105 and 111.

Figure 12:
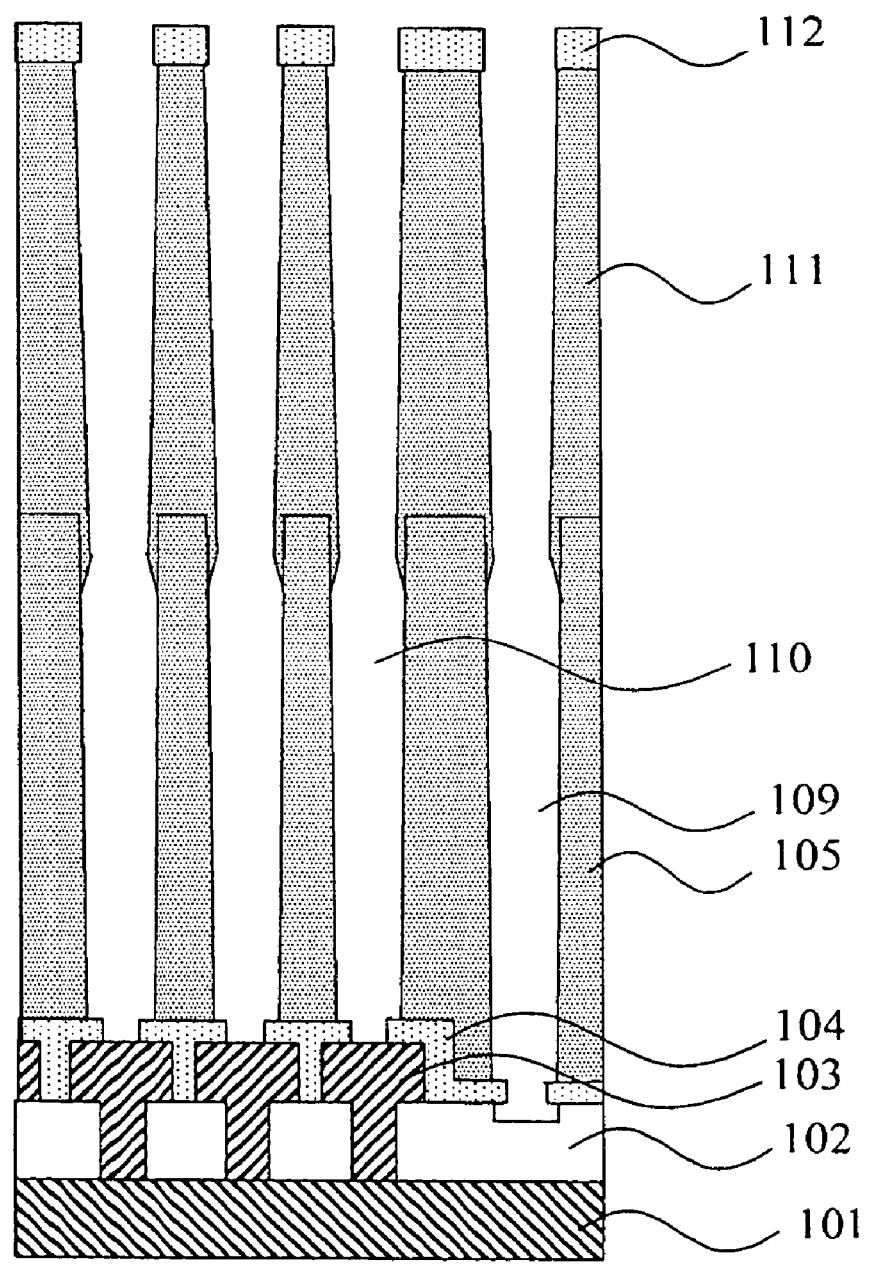
FIG. 12 is a sectional view of the structure in which a step following the step of forming the structure shown in FIG. 11 has been carried out.

Thereafter, as shown in FIG. 12, wet etching may be performed to increase the sizes of the opening 110 and trench 109 by controlling etching conditions so that the adjacent openings do not contact each other.

Figure 13:
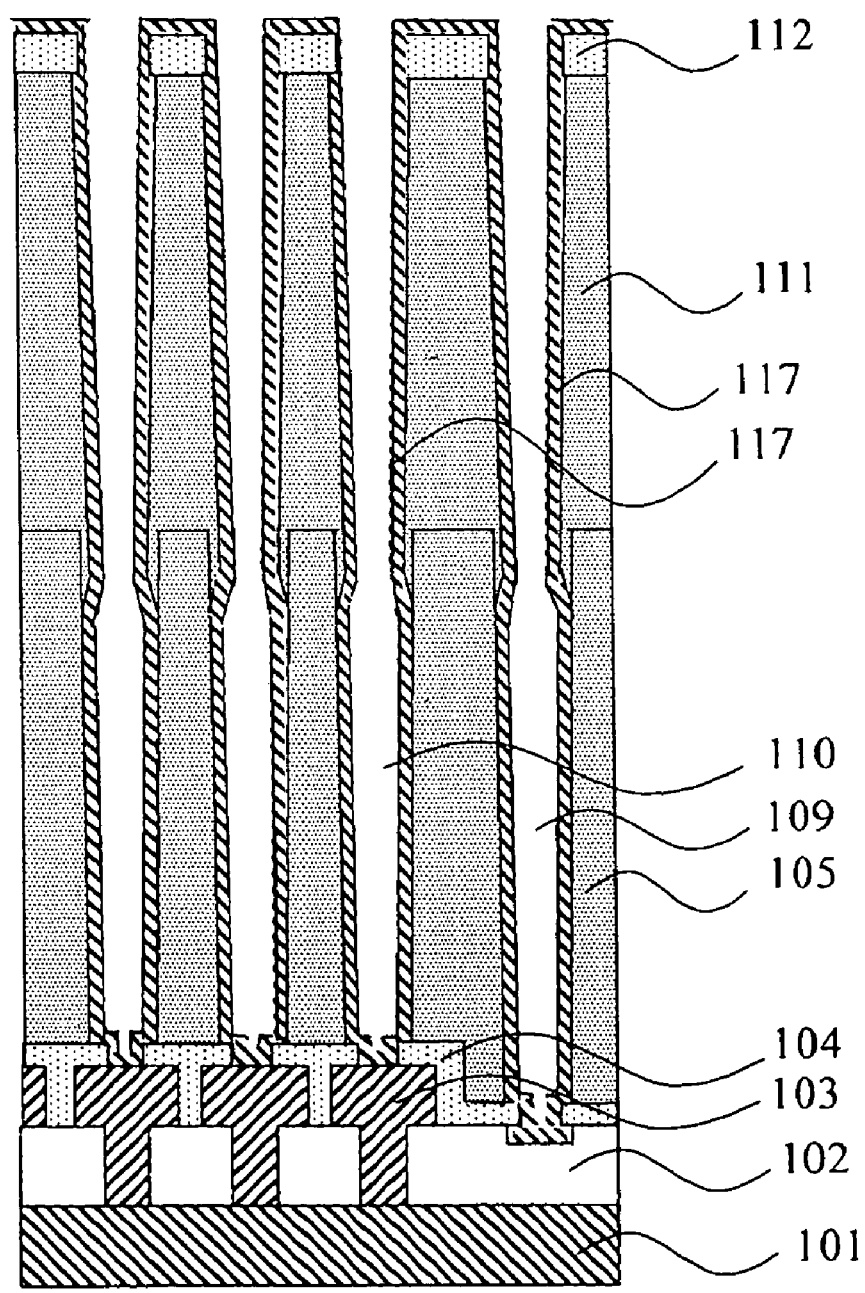
FIG. 13 is a sectional view of the structure in which a step following the step of forming the structure shown in FIG. 12 has been carried out.

Then, as shown in FIG. 13, the exposed inner surfaces of the opening 110 and trench 109 are coated with a conductive film 117 (for example, titanium nitride). The conductive film 117 formed in the trench 109 functions as a guard ring (as described below).

Figure 14:
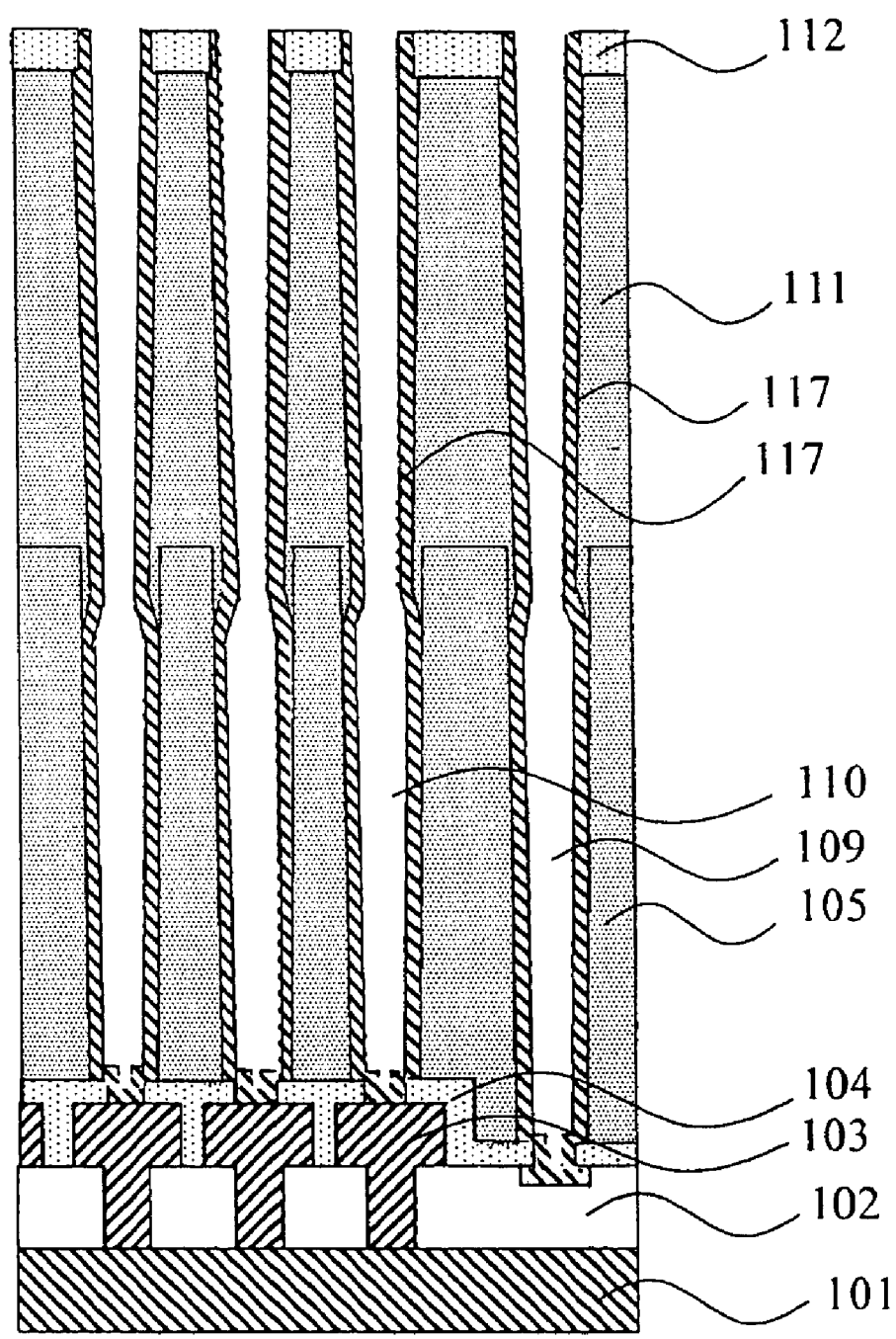
FIG. 14 is a sectional view of the structure in which a step following the step of forming the structure shown in FIG. 13 has been carried out.

Then, as shown in FIG. 14, the conductive film 117 on the silicon nitride film 112 located outside the opening and the trench is removed so as to leave parts of the conductive film 117 covering the inner side walls and inner bottoms of the opening 110 and trench 109. The removal can be performed by etch back using dry etching or by burying a protective insulator in the opening and the trench and then performing CMP. If CMP is performed, the protective insulator is removed after the CMP has been carried out.

Figure 15:
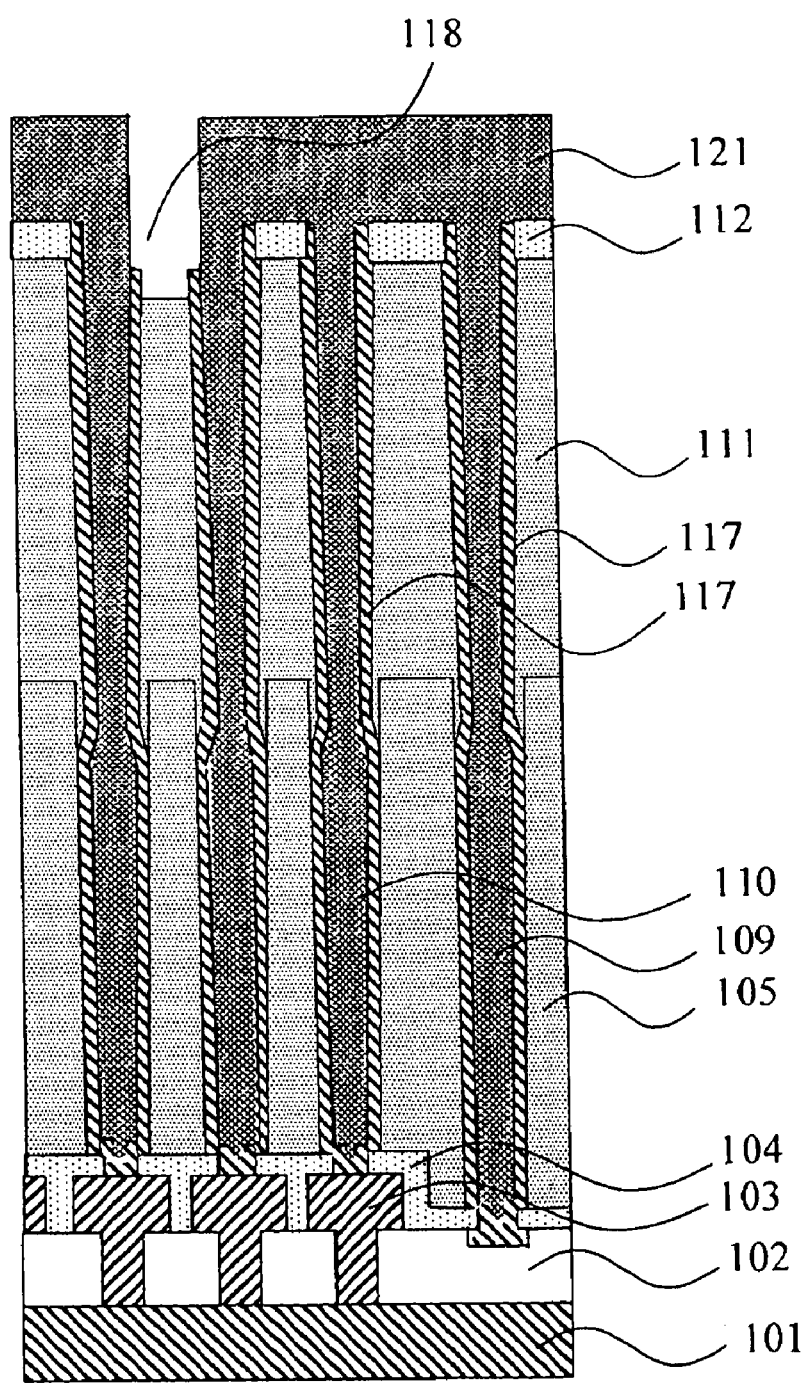
FIG. 15 is a sectional view of the structure in which a step following the step of forming the structure shown in FIG. 14 has been carried out.
Figure 24:
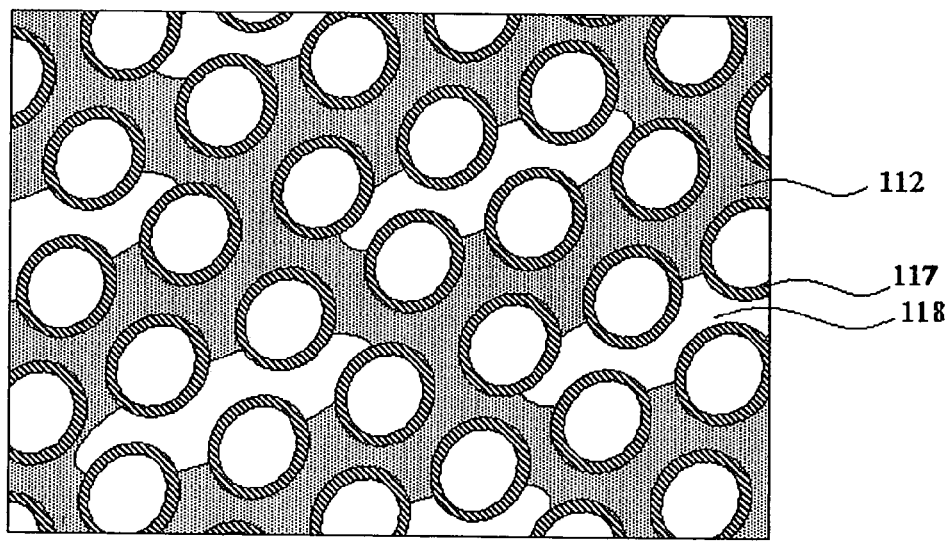
FIG. 24 is a plane view illustrating the second exemplary embodiment.

Then, as shown in FIG. 15, a mask made of a photo resist film 121 is formed. Dry etching is performed using the mask to remove a part of the silicon nitride film 112 corresponding to the opening in the mask to form an opening 118. As shown in the plan view of a memory cell array portion in FIG. 24, a plurality of the openings 118 are formed so that each of the openings 118 is present in each memory cell region. The mask of the photo resist film 121 is thereafter removed.

Figure 16:
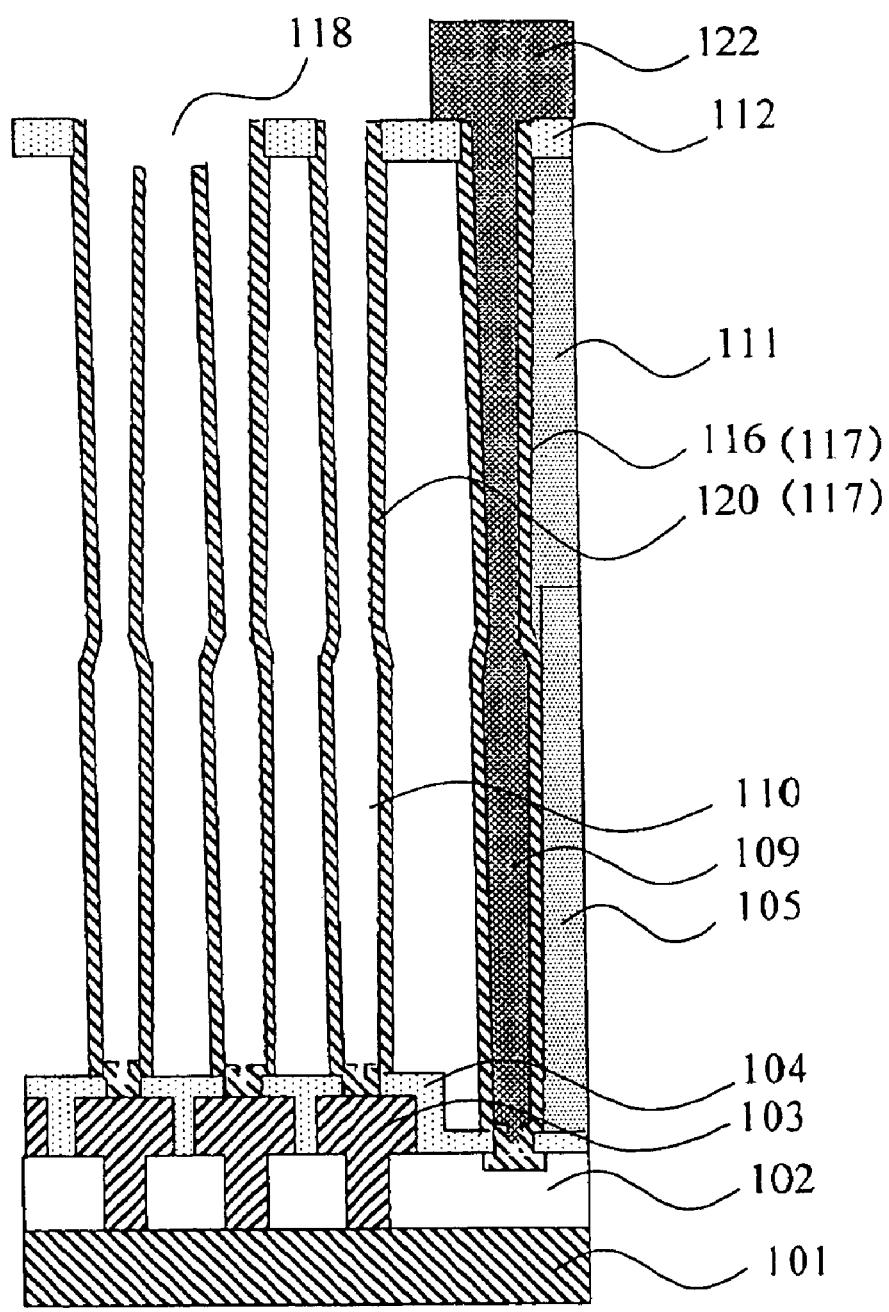
FIG. 16 is a sectional view of the structure in which a step following the step of forming the structure shown in FIG. 15 has been carried out.

Then, as shown in FIG. 16, a photo resist film 122 is formed so as to expose the memory cell array region while covering the other regions and so as to protect the interior of the trench 109. Wet etching is then performed through the opening 118 using an etchant containing hydrofluoric acid as a main component, to remove the first interlayer insulating film 105 and second interlayer insulating film 111 in the memory cell array region surrounded by the guard ring.

Thus, as shown in FIG. 16, the outer surface of the conductive film 117 provided in the opening 110 is exposed. As a result, a lower electrode 120 for a storage node can be obtained which is shaped like a cylinder exposed on both inside and outside. On the other hand, the guard ring 116 made of the conductive film 117 formed in the trench 109 simultaneously with the conductive film 117 in the opening 110 is located so as to surround the memory cell array according to the shape of the trench. The guard ring 116 serves to prevent the first interlayer insulating film 105 and second interlayer insulating film 111 in the region outside the guard ring (the region outside the memory cell array region) from being etched during the above-described wet etching. The photo resist film 122 in the trench 109 allows the etchant to be prevented from permeating the region outside the memory cell array region if a defect such as a crack or a pin hole is present in the guard ring 116. The photo resist film 122 is removed after the wet etching.

Figure 17:
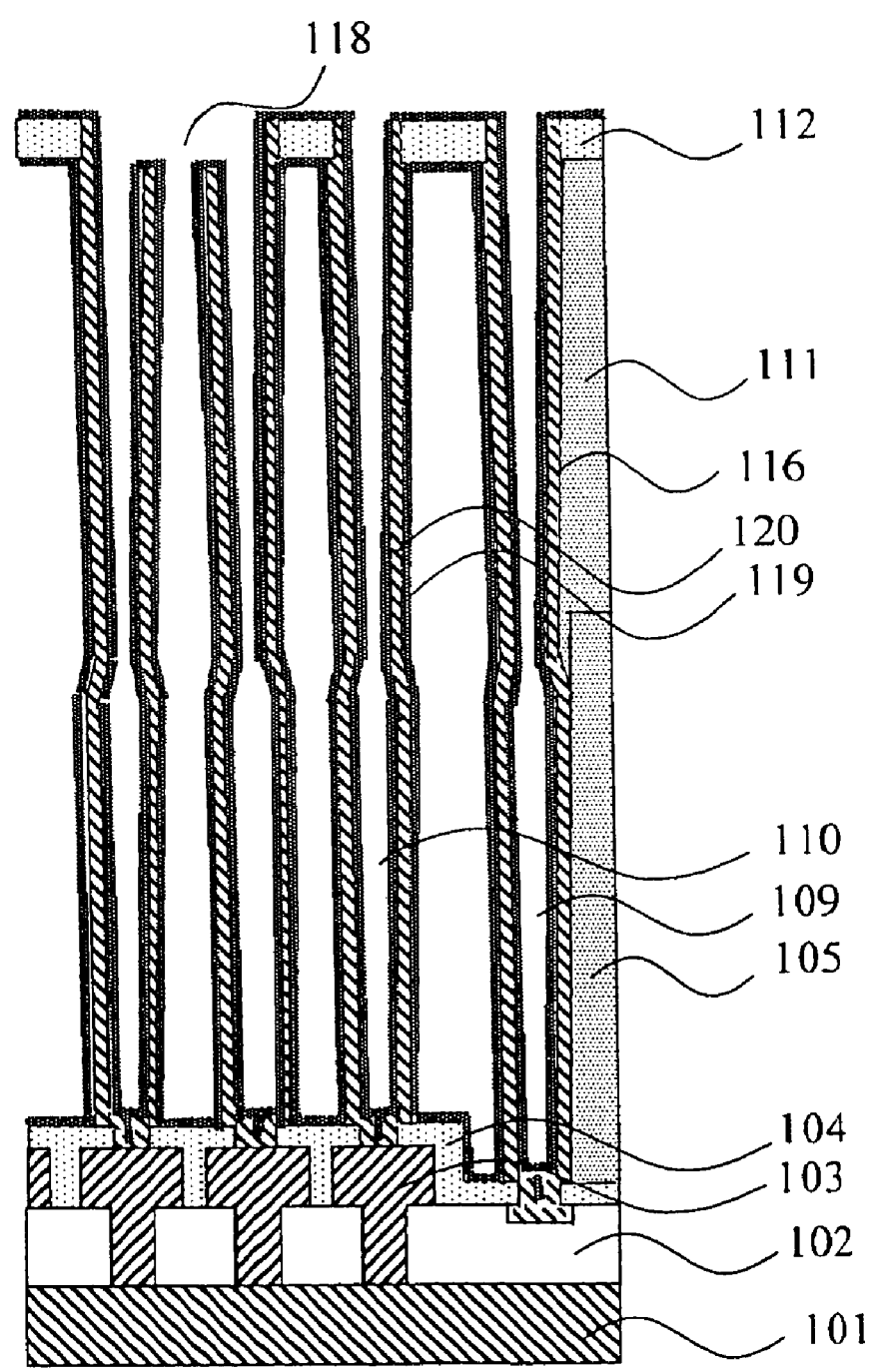
FIG. 17 is a sectional view of the structure in which a step following the step of forming the structure shown in FIG. 16 has been carried out.

Then, as shown in FIG. 17, the exposed surface of the lower electrode 120 (conductive film 117) is covered with a capacitor insulating film 119.

Figure 18:
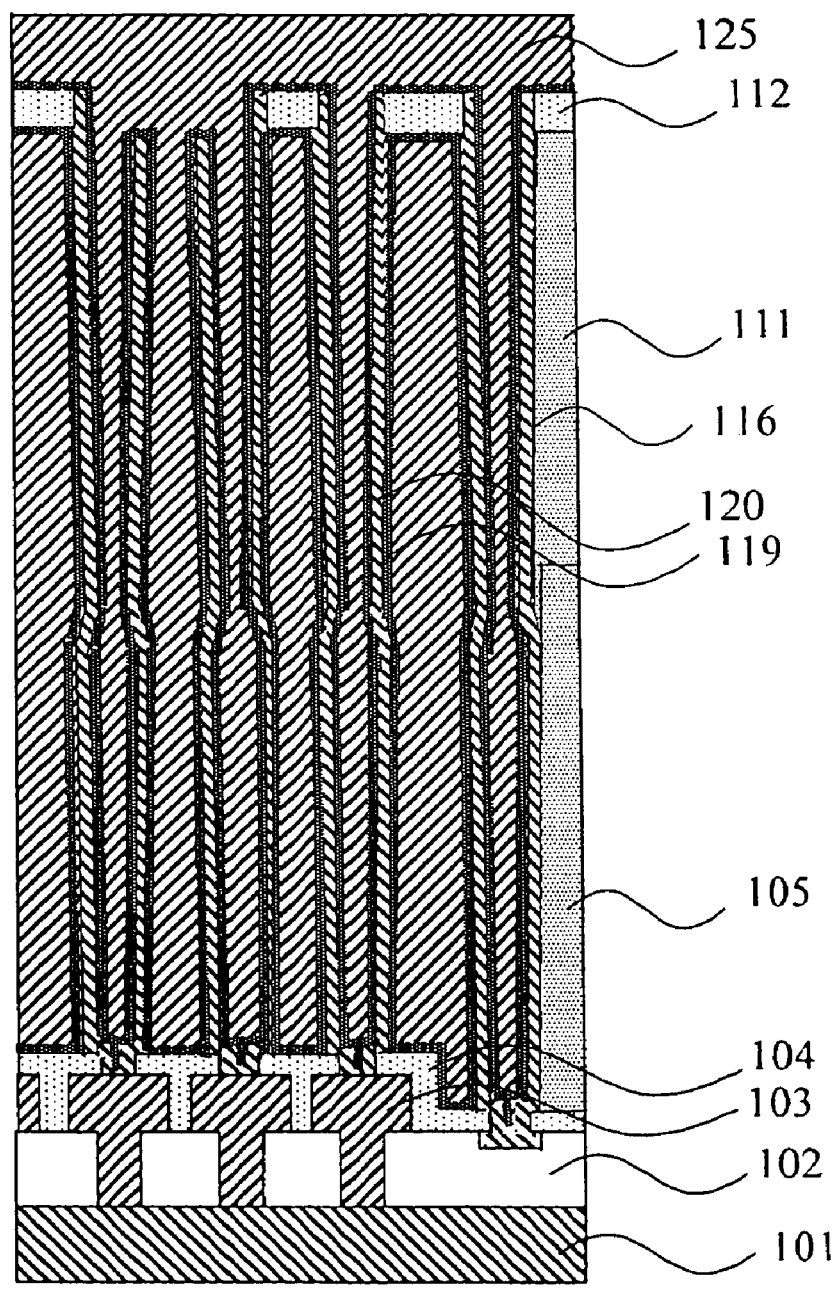
FIG. 18 is a sectional view of the structure in which a step following the step of forming the structure shown in FIG. 17 has been carried out.

Then, as shown in FIG. 18, an upper electrode (plate electrode) 125 for the storage node is formed so as to cover the capacitor insulating film 119. As a result, a capacitor including the lower electrode 120, the capacitor insulating film 119, and the upper electrode 125 is completed.

Here, the opening sizes of the photo masks used to pattern the first opening 110a and the second opening 110b may be the same or different each other.

A case will be described in which during the formation of the second opening 110b, the second opening 110b and the first opening 110a are misaligned. In the case, the opening size of the photo mask for forming the first opening 110a is the same as that of the photo mask for forming the second opening 110b.

Figure 19:
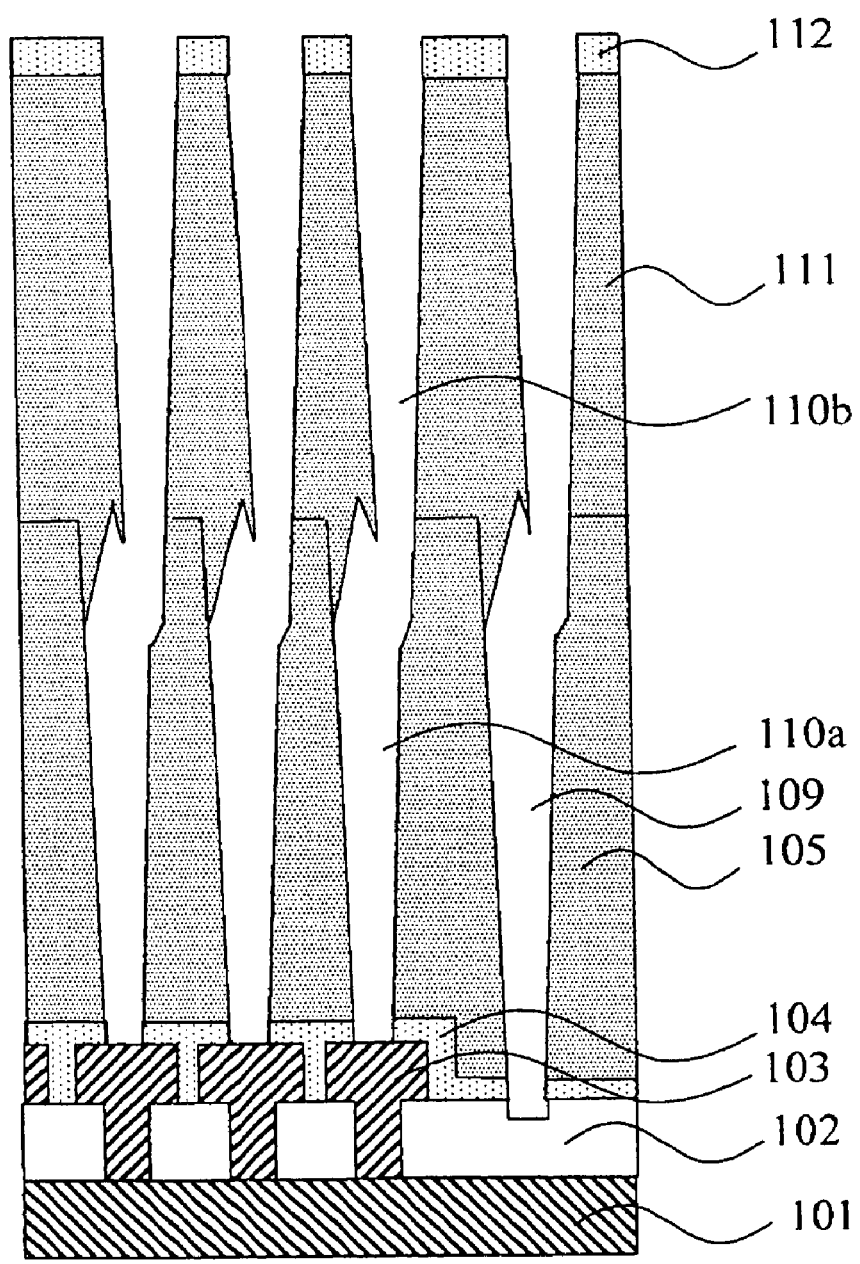
FIG. 19 is a sectional view illustrating the effect of the second exemplary embodiment.
Figure 20:
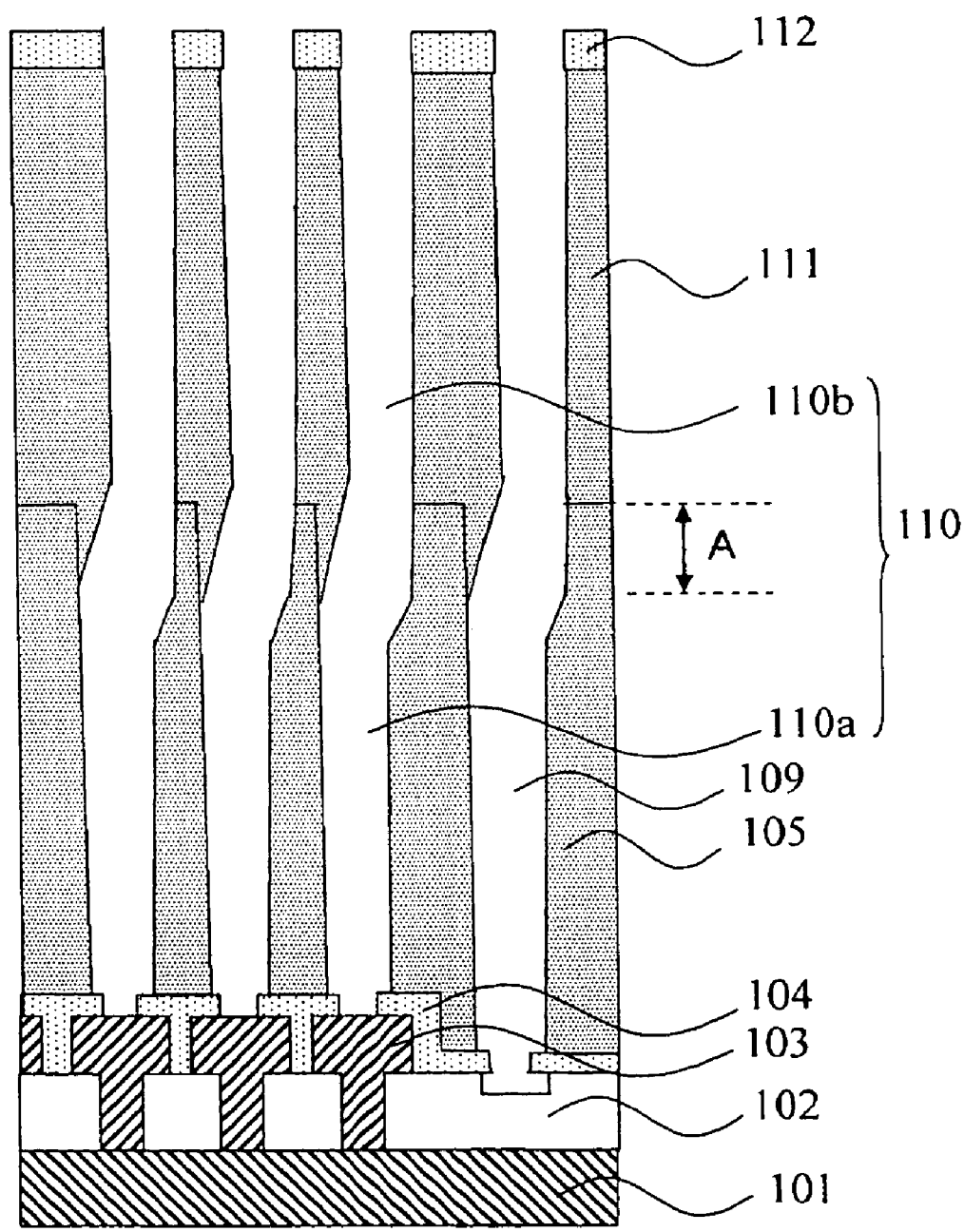
FIG. 20 is a sectional view illustrating the effect of the second exemplary embodiment.

FIG. 19 is a sectional view of the structure after forming the second opening 110b in the case, where misalignment occurs rightward in the drawing during the patterning for forming the second opening 110b. Controlled wet etching is performed in this condition to increase the sizes of the opening 110 and trench 109. The structure shown in FIG. 20 is then obtained. As shown in FIG. 20, during the dry etching for forming the second opening 110b, in a portion in the range shown by "A" in the drawing, a structure is formed in which the top of the first opening 110a is also displaced rightward in the drawing. Thus, even if misalignment occurs, the structure is unlikely to be short-circuited with the adjacent lower plug electrode. In contrast, in the related method of stacking plug electrodes, the position of the top surface of the lower plug is fixed. Hence, if misalignment occurs during the formation of the upper plug electrode, the bottom of the upper plug electrode is likely to be short-circuited with the top surface of the lower adjacent plug electrode.

According to the present exemplary embodiment, a capacitor with a large capacitance value can be easily formed with an increase in manufacturing costs prevented. The manufacturing method according to the present exemplary embodiment is suitable for the manufacture of a high-performance DRAM offering an excellent data holding property (refresh property).

Third Exemplary Embodiment

An example of a case will be described where a contact plug is formed in a peripheral circuit region when a DRAM capacitor is formed in the same manner as in the second exemplary embodiment.

Figure 21:
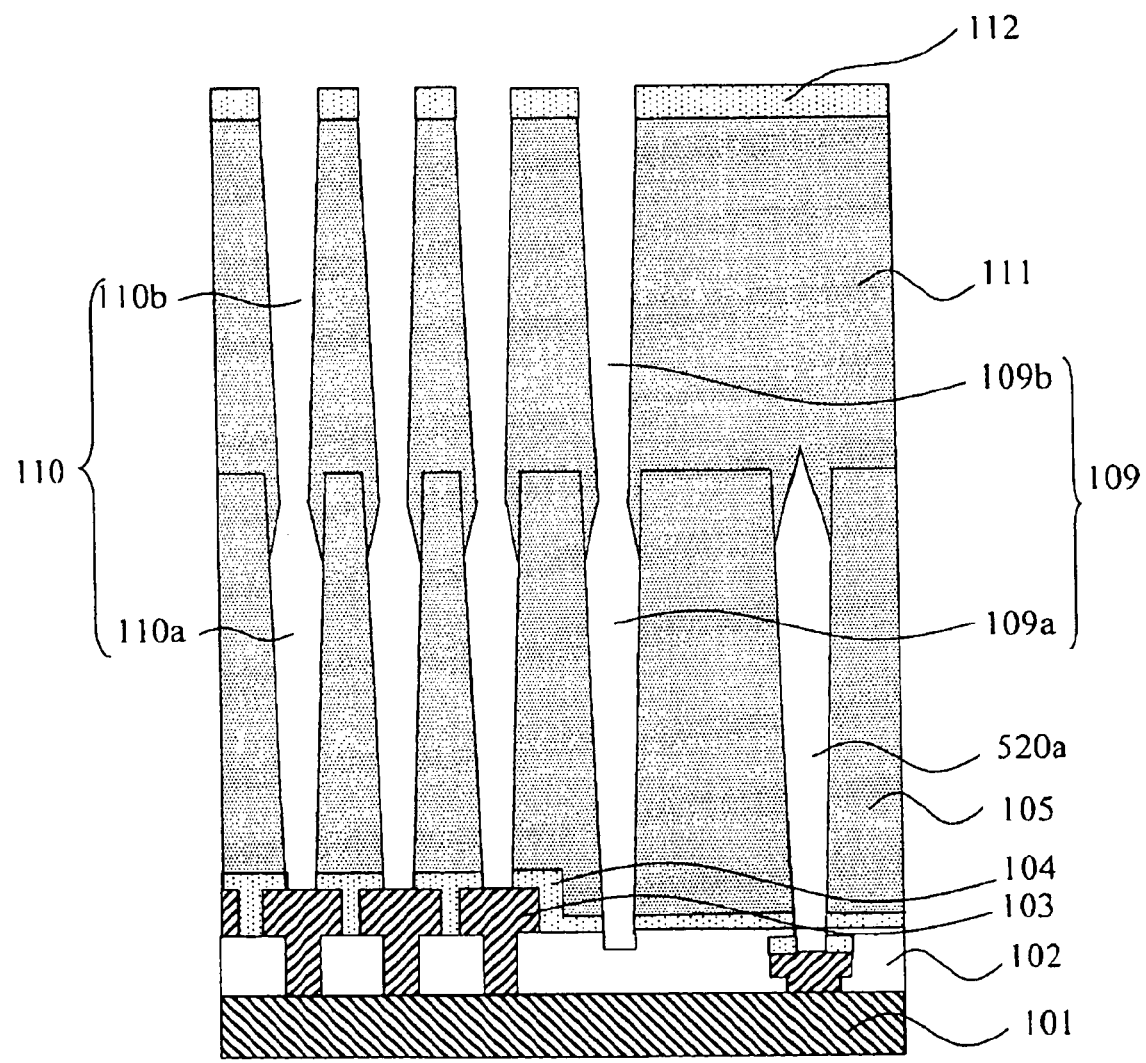
FIG. 21 is a sectional view illustrating a third exemplary embodiment.

When a first opening 110a for forming a capacitor lower electrode and a first opening 109a for forming a guard ring are formed in a first interlayer insulating film 105, a first opening 520a for forming a contact plug in a peripheral circuit region is simultaneously formed on a desired conductive portion. Thereafter, as shown in FIG. 21, in a memory cell array region and in the surrounding region in which a guard ring is to be formed, second openings 110b and 109b are formed in the same manner as in the second exemplary embodiment. At this time, the top of the first opening 520a for forming a contact plug is not opened.

Figure 22:
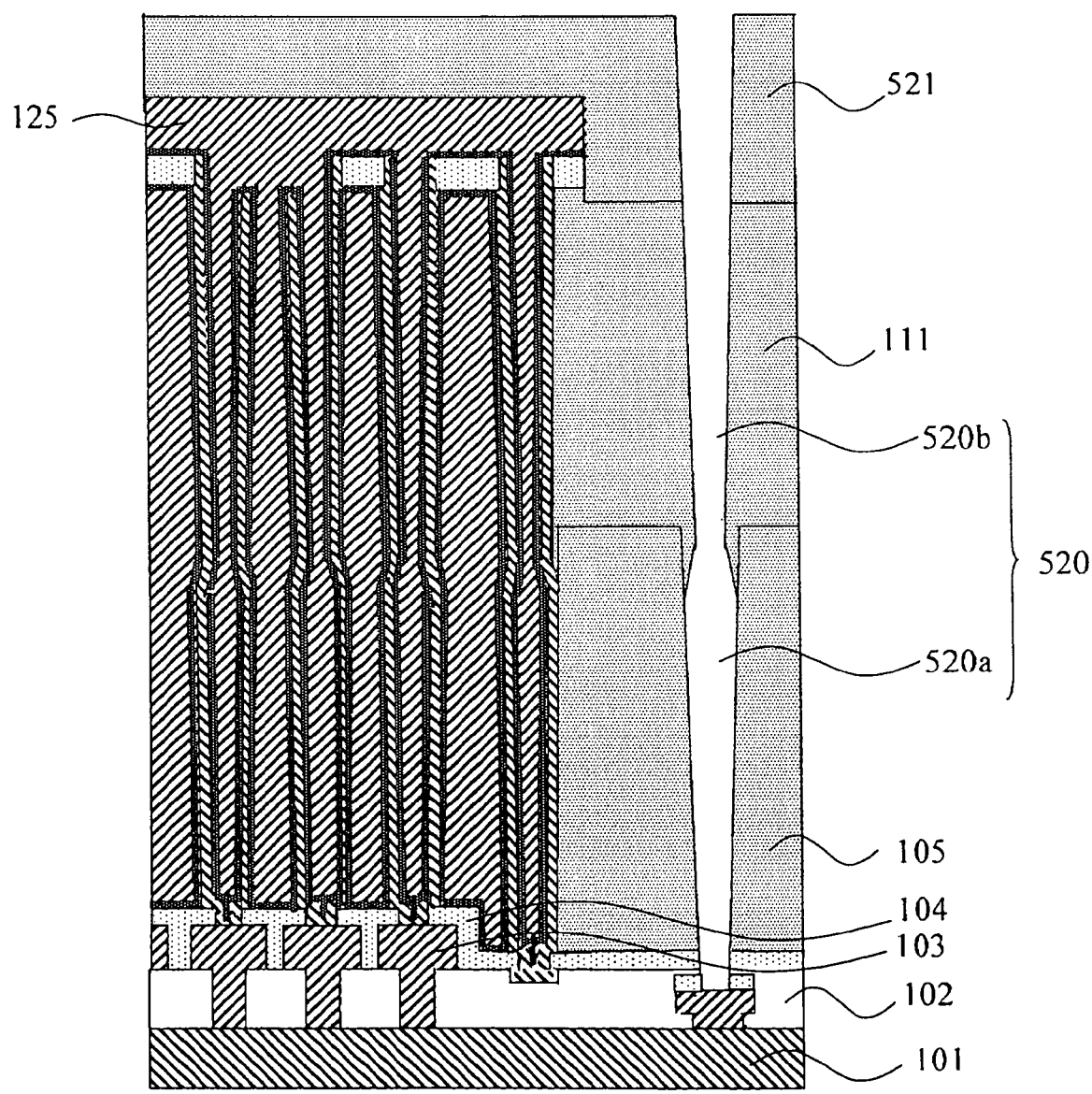
FIG. 22 is a sectional view illustrating the third exemplary embodiment.

Then, as shown in FIG. 22, in the memory cell array region, as is the case with the second exemplary embodiment, a capacitor including a lower electrode 120, a capacitor insulating film 119, and an upper electrode 125 is formed; a guard ring is formed around the periphery of the memory cell array region. A third interlayer insulating film 521 is thereafter formed so as to cover the upper electrode 125. A second opening 520b penetrating the second interlayer insulating film 111 and the third interlayer insulating film 521 is then formed so as to reach the first opening 520a for forming a contact plug. Thus, the first opening 520a and the second opening 520b are connected together to form one continuous opening 520. A conductor such as tungsten (W) is provided so as to fill the opening 520. An excess part of the conductor outside the opening is removed to complete a contact plug.

According to the present exemplary embodiment, a capacitor with a large capacitance value can be formed with an increase in manufacturing costs prevented. Furthermore, a contact plug with a high aspect ratio can be easily formed in the peripheral circuit region.

Fourth Exemplary Embodiment

In the above-described exemplary embodiments, an opening is formed twice to form the target opening (coupling hole). In the present exemplary embodiment, an example of a case will be formed where an opening is formed at least three times to form the target opening (coupling hole).

Figure 23:
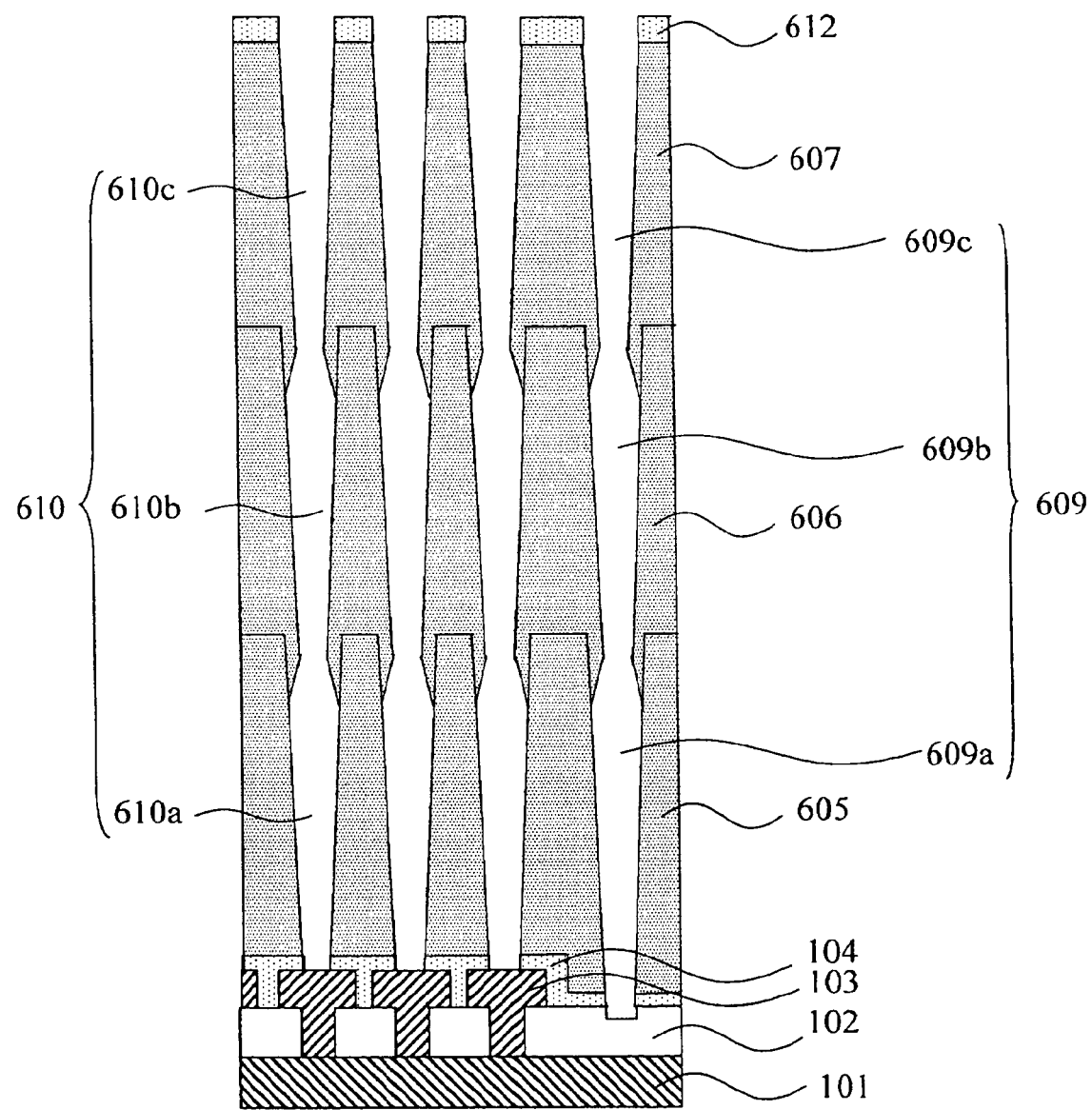
FIG. 23 is a sectional view illustrating a fourth exemplary embodiment.

With reference to FIG. 23, an example will be described in which for example, an opening is formed three times to form the target opening (coupling hole). A first opening 610a and a first trench 609a are formed in a first interlayer insulating film 605. Then, a second interlayer insulating film 606 is formed so as to avoid filling the first opening 610a and first trench 609a. A second opening 610b and a second trench 609b are simultaneously formed; the second opening 610b is connected to the first opening 610a, and the second trench 609b is connected to the first trench 609a. The above-described process can be carried out in the same manner as in the second exemplary embodiment. Then, as is the case with the formation of the second interlayer insulating film, a third interlayer insulating film 607 is formed so as to avoid filling the first and second openings and first and second trenches. Then, as is the case with the formation of the second opening and the second trench, a third opening 610c and a third trench 609c are simultaneously formed in the third interlayer insulating film 607 such that the third opening 610c is connected to the second opening 610b and the third trench 609c is connected to the second trench 609b. As a result, as shown in FIG. 23, an opening 610 where the first, second, and third openings are connected together is obtained; a trench 609 where the first, second, and third trenches are connected together is obtained. A silicon nitride film 612 corresponds to the silicon nitride film 112 in the second exemplary embodiment.

Provided that a desired film can be formed inside the finally formed opening and trench, the numbers of openings and trenches connected together are not particularly limited.

Thus, a capacitor with a large capacitance value can be easily formed according to desired device performance.

It is apparent that the present invention is not limited to the above embodiments, but may be modified and changed without departing from the scope and spirit of the invention.

What is claimed is:

1. A method for manufacturing a semiconductor device comprising:
    forming a first interlayer insulating film over a semiconductor substrate;
    forming a first opening in the first interlayer insulating film;
    forming a second interlayer insulating film on the first interlayer insulating film to cover the first opening such that the first opening is not filled and forms a cavity;
    forming a second opening in the second interlayer insulating film such that the second opening is connected to the first opening to form a coupled opening;
    forming a first conductive film such that the first conductive film covers an inner surface of the coupled opening;
    forming a capacitor insulating film on the first conductive film; and
    forming a second conductive film on the capacitor insulating film to form a capacitor including the first conductive film, the capacitor insulating film, and the second conductive film.

2. The method for manufacturing the semiconductor device according to claim 1,
    wherein a thickness of the first interlayer insulating film is set according to a predetermined opening size of the first opening such that an aspect ratio of the first opening is at most 30, and
    a thickness of the second interlayer insulating film is set according to a predetermined opening size of the second opening such that an aspect ratio of the second opening is at most 30.

3. The method for manufacturing the semiconductor device according to claim 1, wherein the second interlayer insulating film is formed by PE-CVD.

4. The method for manufacturing the semiconductor device according to claim 1, further comprising forming a trench for a guard ring surrounding a memory cell area where the capacitor is disposed, wherein the coupled opening and the trench are formed simultaneously.

5. A method for manufacturing a semiconductor device comprising forming a through-hole in an interlayer insulating film,
    wherein the interlayer insulating film is obtained by stacking a partial interlayer insulating film plural times; and
    the through-hole is obtained by
        forming a lower layer-side partial interlayer insulating film,
        forming an opening in the lower layer-side partial interlayer insulating film,
        forming an upper layer-side partial interlayer insulating film on the lower layer-side partial interlayer insulating film with the opening formed therein to cover the opening such that the opening is not filled and forms a cavity, and
        forming an opening in the upper layer-side partial interlayer insulating film such that the opening in the upper layer-side partial interlayer insulating film is connected to the opening in the lower layer-side partial interlayer insulating film.

6. The method for manufacturing the semiconductor device according to claim 5, wherein a thickness of each of the partial interlayer insulating films is set according to predetermined opening size of each of the openings such that an aspect ratio of each of the openings is at most 30.

7. The method for manufacturing the semiconductor device according to claim 5, further comprising forming a conductive film on the interlayer insulating film to cover an inner side of the through-hole.

8. A method comprising:
forming a first insulating layer over a substrate;
selectively removing the first insulating layer to form a first hole in the first insulating layer;
depositing a second insulating layer over the first insulating layer to cap the first hole by the second insulating layer with leaving a cavity in the first hole;
selectively removing the second insulating layer to form a second hole; the second hole penetrating through the second insulating layer to reach the cavity;
forming a first conductive layer such that the first conductive layer covers an inner surface of the first and second holes;
forming a capacitor insulating layer on the first conductive layer; and
forming a second conductive layer on the capacitor insulating layer to form a capacitor including the first conductive layer, the capacitor insulating layer, and the second conductive layer.

9. The method according to claim 8,
wherein a thickness of the first insulating layer is set according to a predetermined hole size of the first hole such that an aspect ratio of the first hole is at most 30, and
a thickness of the second insulating layer is set according to a predetermined hole size of the second hole such that an aspect ratio of the second hole is at most 30.

10. The method according to claim 8, wherein the second insulating layer is formed by PE-CVD.

11. The method according to claim 8, further comprising forming a trench for a guard ring surrounding a memory cell area where the capacitor is disposed, wherein the first and second holes and the trench are formed simultaneously.

* * * * *